(12) United States Patent
Yamasaki

(10) Patent No.: US 7,462,440 B2
(45) Date of Patent: Dec. 9, 2008

(54) LITHOGRAPHIC PRINTING PLATE PRECURSOR AND LITHOGRAPHIC PRINTING METHOD USING THE SAME

(75) Inventor: Sumiaki Yamasaki, Shizuoka (JP)

(73) Assignee: FUJIFILM Corporation, Kanagawa (JP)

( * ) Notice: Subject to any disclaimer, the term of this patent is extended or adjusted under 35 U.S.C. 154(b) by 0 days.

(21) Appl. No.: 11/091,871

(22) Filed: Mar. 29, 2005

(65) Prior Publication Data

US 2005/0221226 A1    Oct. 6, 2005

(30) Foreign Application Priority Data

| Mar. 29, 2004 | (JP) | ............. P.2004-095713 |
| Sep. 22, 2004 | (JP) | ............. P.2004-274803 |
| Sep. 22, 2004 | (JP) | ............. P.2004-274804 |

(51) Int. Cl.
*G03F 7/00* (2006.01)
*G03F 7/004* (2006.01)

(52) U.S. Cl. .............. 430/302; 430/270.1; 430/281.1; 430/283.1; 430/286.1

(58) Field of Classification Search .............. 430/302, 430/270.1, 281.1, 283.1, 286.1
See application file for complete search history.

(56) References Cited

U.S. PATENT DOCUMENTS

| 5,795,698 | A | 8/1998 | Fitzgerald et al. |
| 6,482,571 | B1 | 11/2002 | Teng |
| 6,582,882 | B2 * | 6/2003 | Pappas et al. ............. 430/271.1 |
| 7,026,097 | B2 * | 4/2006 | Hoshi et al. ............... 430/281.1 |
| 2005/0008971 | A1 * | 1/2005 | Mitsumoto et al. ........ 430/270.1 |
| 2005/0069811 | A1 | 3/2005 | Mitsumoto et al. |

FOREIGN PATENT DOCUMENTS

| EP | 1 031 412 A1 | 8/2000 |
| EP | 1 147 885 A2 | 10/2001 |
| EP | 1 203 660 A1 | 5/2002 |
| EP | 1518672 A2 * | 3/2005 |
| JP | 2938397 B2 | 6/1999 |
| JP | 2001-277740 A | 10/2001 |
| JP | 2001-277742 A | 10/2001 |
| JP | 2002-287334 A | 10/2002 |
| JP | 2002287334 A * | 10/2002 |

OTHER PUBLICATIONS

English language abstract of JP 2002-287334.*

* cited by examiner

*Primary Examiner*—Amanda C. Walke
(74) *Attorney, Agent, or Firm*—Birch, Stewart, Kolasch & Birch, LLP

(57) ABSTRACT

A lithographic printing plate precursor capable of forming an image without undergoing alkali development, which comprises a hydrophilic support and a laser-sensitive photopolymerizing layer, wherein the photopolymerizing layer contains a polymer compound having at least one of an ether group, an ester group and an amido group in its molecule, particularly, in its side chain.

15 Claims, No Drawings

LITHOGRAPHIC PRINTING PLATE PRECURSOR AND LITHOGRAPHIC PRINTING METHOD USING THE SAME

FIELD OF THE INVENTION

The present invention relates to a lithographic printing plate precursor and a lithographic printing method using the same. More specifically, it related to a lithographic printing plate precursor capable of undergoing a so-called direct plate-making, which can be directly plate-made by scanning of laser having, for example, a wavelength of from 300 to 1,200 nm, based on digital signals, for example, a computer, and a lithographic printing method wherein the above-described lithographic printing plate precursor is directly developed on a printing machine to conduct printing without undergoing a development processing step.

BACKGROUND OF THE INVENTION

In general, a lithographic printing plate is composed of an oleophilic image area accepting ink in the process of printing and a hydrophilic non-image area accepting dampening water Lithographic printing is a printing method comprising rendering the oleophilic image area of the lithographic printing plate to an ink-receptive area and the hydrophilic non-image area thereof to a dampening water-receptive area (ink unreceptive area), thereby making a difference in adherence of ink on the surface of the lithographic printing plate, depositing the ink only to the image area by utilizing the nature of the dampening water and oily ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate making according to a method of exposing the lithographic printing plate precursor through an original, for example, a lith film, and then removing the image-recording layer in the non-image area by dissolving with an alkaline developing solution or an organic solven thereby revealing the hydrophilic surface of support while leaving the image-recording layer in the image area.

In the hitherto known plate-making process of lithographic printing plate precursor, after exposure, the step of removing the non-image area by dissolving, for example, with a developing solution corresponding to the image-recording layer is required. However, it is one of the subjects to save or simplify such an additional wet treatment described above Particularly, since disposal of liquid wastes discharged accompanying the wet treatment has become a great concern throughout the field of industry in view of the consideration for global environment in recent years, the demand for the solution of the above-described subject has been increased more and more.

As one of simple plate-making methods in response to the above-described requirement, it has been proposed a method referred to as on-machine development wherein a lithographic printing plate precursor having an image-recording layer capable of being removed in a conventional printing process is used and after exposure, the undesirable area of the image-recording layer is removed on a printing machine to prepare a lithographic printing plate.

Specific methods of the on-machine development include, for example, a method of using a lithographic printing plate precursor having an image-recording layer that can be dissolved or dispersed in dampening water, an ink solvent or an emulsion of dampening water and ink, a method of mechanically removing an image-recording layer by contact with rollers or a blanket cylinder of a printing machine, and a method of lowering cohesion of an image-recording layer or adhesion between an image-recording layer and a support upon penetration of dampening water, ink solvent or the like and then mechanically removing the image-recording layer by contact with rollers or a blanket cylinder of a printing machine.

In the invention, unless otherwise indicated particularly, the term "development processing step" means a step of using an apparatus (ordinarily, an automatic developing machine) other than a printing machine and removing a laser-unexposed area in the lithographic printing plate precursor upon contact with liquid (ordinarily, an alkaline developing solution) thereby revealing a hydrophilic surface of support. The term "on-machine development" means a method and a step of removing a laser-unexposed area in the lithographic printing plate precursor upon contact with liquid (ordinarily, printing ink and/or dampening water) by using a printing machine thereby revealing a hydrophilic surface of support.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate (CTP) technique of carrying digitalized image information on highly converging radiation, for example, laser light and conducting scanning exposure of a lithographic printing plate precursor with the light thereby directly preparing a lithographic printing plate without using a Jith film. Thus, it is one of important technical subjects to obtain a lithographic printing plate precursor adaptable to the technique described above.

As a lithographic printing plate precursor capable of undergoing scanning exposure among the lithographic printing plate precursors, a lithographic printing plate precursor comprising a hydrophilic support having provided thereon an oleophilic photosensitive resin layer containing a photosensitive compound capable of generating an active species, for example, a radical or a Bronsted acid by laser exposure has been proposed and such a printing plate precursor has been put on the market. A negative lithographic printing plate can be obtained by subjecting the lithographic printing plate precursor to laser scanning on the basis of digital information to generate an active species, causing a physical or chemical change in the photosensitive layer by the action of the active species to make the photosensitive layer insoluble, and then development processing the lithographic printing plate precursor. Particularly, a lithographic printing plate precursor comprising a hydrophilic support having provided thereon a photopolymerization type photosensitive layer containing a photopolymerization initiator excellent in photo-speed, an addition polymerzable ethylenically unsaturated compound and a binder polymer soluble in an alkali developing solution and, if desired, an oxygen-blocking protective layer can provide a lithographic printing plate having desired printing properties, for example, excellent productivity, ease of undergoing development processing, and good resolving power and ink receptivity.

As a lithographic printing plate precursor capable of undergoing on-machine development, for example, lithographic printing plate precursors having provided on a hydrophilic support, an image-forming layer in which hydrophobic thermoplastic polymer particles are dispersed in a hydrophilic binder are described in Patent Document 1. It is described in Patent Document 1 that the lithographic printing plate precursor can be exposed to an infrared laser to agglomerate the hydrophobic thermoplastic polymer particles by heat thereby forming an image, and mounted on a cylinder of a printing machine to carry out on-machine development by supplying dampening water and/or ink.

Although the method of forming image by the agglomeration of fine particles only upon thermal fusion shows good on-machine development property, it has a problem in that the image strength (adhesion to the support) is extremely weak and printing durability is insufficient.

Further, lithographic printing plate precursors having provided on a hydrophilic support, microcapsules containing a polymerizable compound encapsulated therein have been proposed (for example, see Patent Documents 2 and 3).

Moreover, lithographic printing plate precursors having provided on a support, a photosensitive layer containing an infrared absorbing agent, a radical polymerization initiator and a polymerizable compound have been proposed (for example, see Patent Document 4).

The methods using the polymerization reaction has a feature that since chemical bond density in the image area is high, the image strength is relatively good in comparison with the image area formed by the thermal fusion of fine polymer particles. However, from a practical standpoint, any of the on-machine development property, printing durability and polymerization efficiency (sensitivity) is still insufficient and the methods have not been put into practical use.

Patent Document 1: Japanese Patent 2,938,397

Patent Document 2: JP-A 2001-277740 (the term "JP-A" as used herein means an "unexamined published Japanese patent application")

Patent Document 3: JP-A-2001-277742

Patent Document 4: JP-A 2002-287334

SUMMARY OF THE INVENTION

Therefore, an object of the invention is to provide a lithographic printing plate precursor capable of conducting image recording by laser exposure.

Another object of the invention is to provide a lithographic printing method capable of providing a large number of good printing materials by a practical exposure energy amount, which comprises using the lithographic printing plate precursor capable of conducting image recording by laser exposure, recording an image directly from digital data, for example, a computer and conducting on-machine development without undergoing development processing step.

The invention includes the following items.

1. A lithographic printing plate precursor capable of forming an image without undergoing alkali development, which comprises a hydrophilic support and a laser-sensitive photopolymerizing layer, wherein the photopolymerizing layer contains a polymer compound having at least one of an ether group, an ester group and an amido group.
2. The lithographic printing plate precursor as described in 1, wherein the ether group, ester group and amido group are represented by the following formulae (1), (2) and (3), respectively:

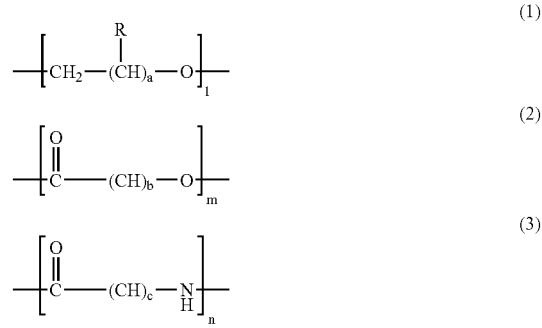

wherein R represents a hydrogen atom or a methyl group; a represents an integer of 1, 3 or 5; b represents an integer of from 2 to 5; c represents an integer of from 2 to 7; and l, m and n each independently represents an integer of from 1 to 100.

3. The lithographic printing plate precursor as described in 2, wherein the polymer compound has the ether group represented by formula (1).
4. The lithographic printing plate precursor as described in 3, wherein l in formula (1) is an integer of from 1 to 9.
5. The lithographic printing plate precursor as described in 3, wherein l in formula (1) is an integer of from 1 to 4.
6. The lithographic printing plate precursor as described in 3, wherein l in formula (1) is 2.
7. The lithographic printing plate precursor as described in 2, wherein the polymer compound has the ester group represented by formula (2) or the amido group represented by formula (3).
8. The lithographic printing plate precursor as described in any one of 1 to 7, wherein the polymer compound has a glass transition temperature (Tg) of 90° C. or lower.
9. The lithographic printing plate precursor as described in any one of 1 to 8, wherein the photopolymerizing layer further contains a microcapsule.
10. The lithographic printing plate precursor as described in any one of 1 to 9, wherein the photopolymerizing layer further contains an infrared absorbing agent, a polymerization initiator and a polymerizable compound.
11. A lithographic printing method which comprises: mounting the lithographic printing plate precursor as described in any one of 1 to 10 on a printing machine and then imagewise exposing the lithographic printing plate precursor by a laser; or imagewise exposing the lithographic printing plate precursor as described in any one of 1 to 10 by a laser and then mounting the exposed lithographic printing plate precursor on a printing machine; and supplying printing ink and dampening water to the exposed lithographic printing plate precursor, thereby removing a laser-unexposed area of the photopolymerizing layer to conduct printing.

DETAIL DESCRIPTION OF THE INVENTION

In the invention, it is presumed that by using the polymer compound having an ether group, an ester group or an amido group in its molecule as a binder polymer, since the glass transition temperature (hereinafter also simply referred to as Tg sometimes) thereof is relatively low, preferably 90° C. or lower, a layer formed has flexibility and a week physical strength so that development can rapidly proceed. On the other hand, in the exposed area, mobility of a radical generated at the exposure increases so that polymerization can efficiently proceed and consequently, a hardened layer having high crosslinking density can be formed in the exposed area. As a result, it is presumed that permeation of dampening water at the on-machine development and formation of permeation pass of dampening water by solving out of other components (for example, an ethylenically unsaturated compound or a radical polymerization initiator) are restrained in the hardened layer to ensure retention of mechanical strength of the hardened layer.

According to the invention, a lithographic printing plate precursor that is excellent in on-machine development property and exhibits good fine line reproducibility and printing durability, and a lithographic printing method using the lithographic printing plate precursor can be provided.

The present invention will be described in more detail below.

The lithographic printing plate precursor of the invention has a laser-sensitive photopolymerizing layer on a hydrophilic support. The constituting components of the photopolymerizing layer are described below.

<Photopolymerizing Layer>

[Binder Polymer]

In the invention, a polymer compound (hereinafter also referred to as a "specific polymer compound" sometimes) having at least one of an ether group, an aster group and an amido group in its molecule is specifically used as an essential component of a binder polymer for the purpose of improving film property and on-machine development property of the photopolymerizing layer.

The polymer compound having an ether group is described below.

The polymer compound having an ether group includes preferably a polymer compound having an ether group represented by formula (1) shown below in its molecule.

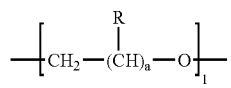

In formula (1), R represents a hydrogen atom or a methyl group; a represents an integer of 1, 3 or 5; and 1 represents an integer of from 1 to 9. In formula (1), 1 preferably represents an integer of from 1 to 8, more preferably an integer of from 1 to 7, still more preferably an integer of from 1 to 6, particularly preferably an integer of from 1 to 4, and most preferably 2.

The specific polymer compound according to the invention may contain an ether group other than the ether group represented by formula (1) described above.

Further, the specific polymer compound containing an ether group according to the invention may contain an ester group represented by formula (2) shown below or an amido group represented by formula (3) shown below in its molecule.

The polymer compound having an ester group or an amido group is described below.

The polymer compound having an ester group or an amido group includes preferably a polymer compound having an ester group represented by formula (2) shown below or an amido group represented by formula (3) shown below in its molecule.

In the above formulae, b represents an integer of from 2 to 5; c represents an integer of from 2 to 7; and m and n each independently represents an integer of from 1 to 100.

Further, the specific polymer compound containing an ester group or an amido group according to the invention may contain an ether group represented by formula (1) described above.

The specific polymer compound having an ether group, an ester group or an amido group in its molecule preferably has a class transition temperature (Tg) of 90° C. or lower.

The term "glass transition temperature (Tg)" as used herein means temperature corresponding to an intersection of two straight lines when a volume weight ratio of a polymer substance is measured as a function of temperature as defined in *Kobunshi Kagaku* (Polymer Chemistry), Kyoritsu Shuppan Co., Ltd. (1993) and a value measured by differential scanning calorimeter (DSC) is adopted.

As the polymer compound according to the invention, that having Tg of 90° C. or lower is preferred, and that having Tg of lower than 70° C. is more preferred in view of improvements in the on-machine development property and polymerization efficiency by exposure. The lower limit of Tg is not particularly limited but it is preferably −50° C. or higher from the standpoint of preservation stability.

In order to adjust Tg to a desired value with respect to the polymer compound according to the invention, a functional group having a straight chain partial structure is introduced into a structural unit constituting the polymer compound, and such a functional group can be introduced into either one kind or two or more kinds of structural units depending on the purpose. Thus, a main chain structure of the polymer compound according to the invention is not particularly limited. Preferred examples of the main chain structure include a poly(meth)acrylic resin, a polyurethane resin, an acetal-modified polyvinyl resin. Of the compounds, the poly(meth)acrylic resin is preferred in view of the printing properties, for example, ink receptivity. Accordingly, in order to decrease Tg of a polymer compound having a poly(meth)acrylic main chain to 90° C. or below, the polymer compound must contain the structural unit represented by formula (1) in the side chain thereof. In this case, the polymer compound may contain a plurality of the structural units different from each other.

The specific polymer compound according to the invention may contain as a copolymer component, a radical polymerizable compound having a hydrophilic group, in order to improve various properties, for example, on-machine development property. The hydrophilic group is preferably not alkali-soluble, and includes, for example, an amido group, a hydroxy group and an onium salt group, preferably an amido group and a hydroxy group. Specific examples of the radical polymerizable compound having a hydrophilic group include acrylamide, methacrylamide, N,N-dimethylacrylamide, N-isopropylacrylamide, N-vinylpyrrolidone, N-vinylacetamide, N-acryloylmorpholine, 2-hydroxyethyl acrylate and 2-hydroxyethyl methacrylate. One or more kinds of the radical polymerizable compounds having a hydrophilic group may be used. A content of the copolymerization component is preferably from 0 to 85% by mole, and particularly preferably from 5 to 70% by mole.

It is also a preferred embodiment that the specific polymer compound according to the invention may contain as a copolymer component, other radical polymerizable compound in addition to the above-described radical polymerizable compound as long as the effects of the invention are not degraded for the purpose of improving various properties, for example, image strength Examples of the radical polymerizable compound that can be copolymerized in the specific polymer compound according to the invention include radical polymerizable compounds selected from an acrylate, a methacrylate, a N,N-disubstituted acrylamide, a N,N-disubstituted methacrylamide, a styrene, an acrylonitrile and a methacrylonitrile.

Specific examples thereof include an acrylate, for example, an alkyl acrylate (preferably having from 1 to 20 carbon atoms in the alkyl group thereof) (e.g., methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimetylolpropane monoacrylate, pentaerythritol monoacrylate, glycidyl acrylate, benzyl acrylate, methoxybenzyl acrylate, furfuryl acrylate or tetrahydrofurfuryl acrylate) or an aryl acrylate (e.g., phenyl acrylate), a methacrylate, for example, an alkyl methacrylate (preferably having from 1 to 20 carbon atoms in the alkyl group thereof) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimetylolpropane monomethacrylate, pentaerythritol monomethacrylate, glycidyl methacrylate, furfuryl methacrylate or tetrahydrofurfuryl methacrylate) or an aryl methacrylate (e.g., phenyl methacrylate, cresyl methacrylate or naphthyl methacrylate), styrene, a styrene derivative, for example, an alkylstyrene (e.g., methylstyrene, dimethylstyrene, trimethylstyrene, ethylstyrene, diethylstyrene, isopropyistyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (e.g., methoxystyrene, 4methoxy-3-methylstyrene or dimethoxystyrene), or a halogenostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile and methacrylonitrile.

Of the radical polymerizable compounds, acrylates, methacrylates and styrenes are preferably used. One or more kinds of the radical polymerizable compounds may be used. A content of the copolymerization component is preferably from 0 to 95% by mole, and particularly preferably from 20 to 90% by mole.

The specific polymer compound according to the invention may be a homopolymer, a copolymer of radical polymerizable compounds having a group represented by formula (1), (2) or (3) different from each other or a copolymer of one or more radical polymerizable compounds having a group represented by formula (1), (2) or (3) and one or more of other radical polymerizable compounds described above. In the case of the copolymer, the structure thereof may be any of a block copolymer, a random copolymer and a graft copolymer.

A solvent for use in the synthesis of the specific polymer compound includes, for example, ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide dimethylsolfoxide, toluene, ethyl acetate, methyl lactate and ethyl lactate. The solvents may be used individually or as a mixture of two or more thereof.

The specific polymer compound according to the invention preferably has a weight average molecular weight of 2,000 or more, and more preferably in a range of from 5,000 to 300,000. The specific polymer compound according to the invention may contain an unreacted monomer. The content of the unreacted monomer is desirably 15% by weight or less in the specific polymer compound. The content of specific polymer compound included in the photopolymerizing layer according to the invention is preferably from about 5 to 95% by weight, and more preferably from about 10 to 85% by weight in terms of solid content. In the above-described range, preferable strength of the image area and image-forming property are obtained.

Specific examples of the constituting unit of the specific polymer compound used as a binder polymer in the invention are set forth below, but the invention should not be construed as being limited thereto.

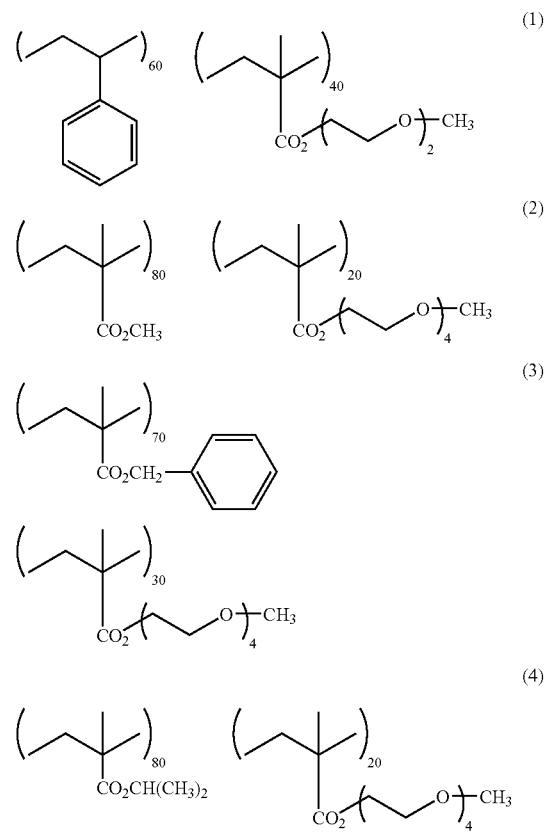

-continued
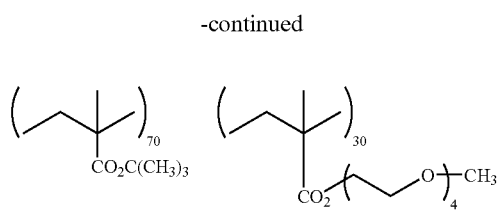
(5)
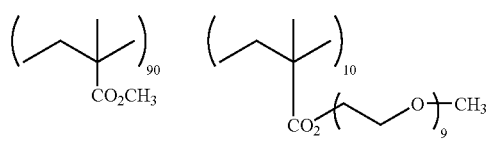
(6)
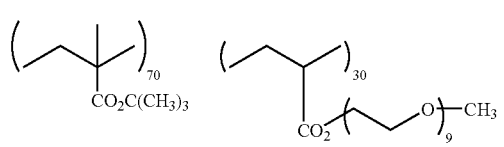
(7)
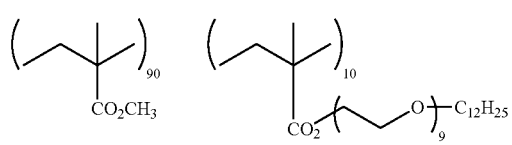
(8)
(9)
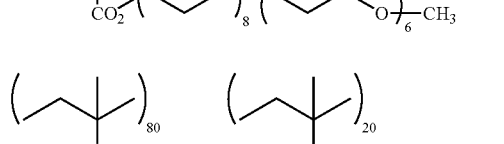
(10)
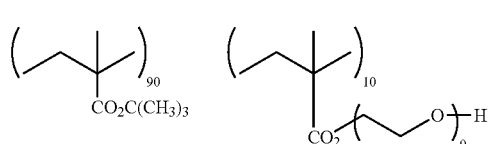
(11)
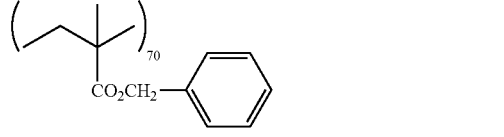
(12)
-continued
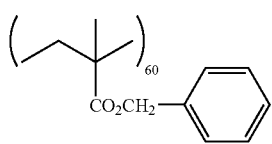
(13)
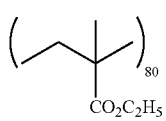
(14)
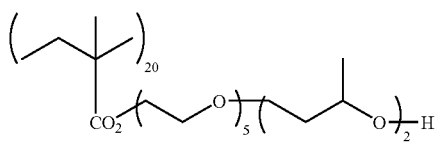
(15)
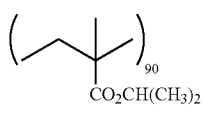
(16)
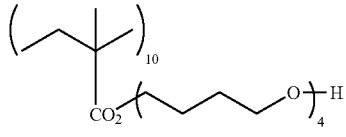
(17)
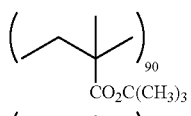
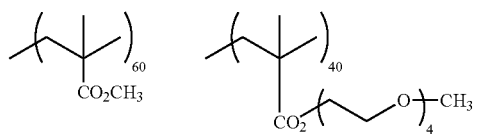
(18)

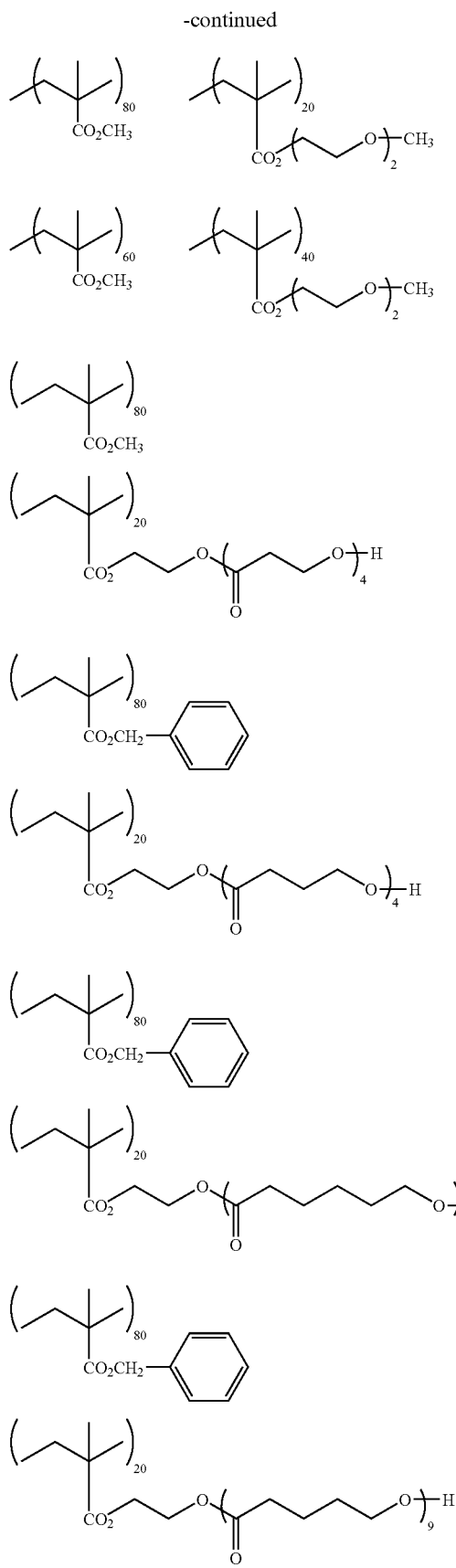
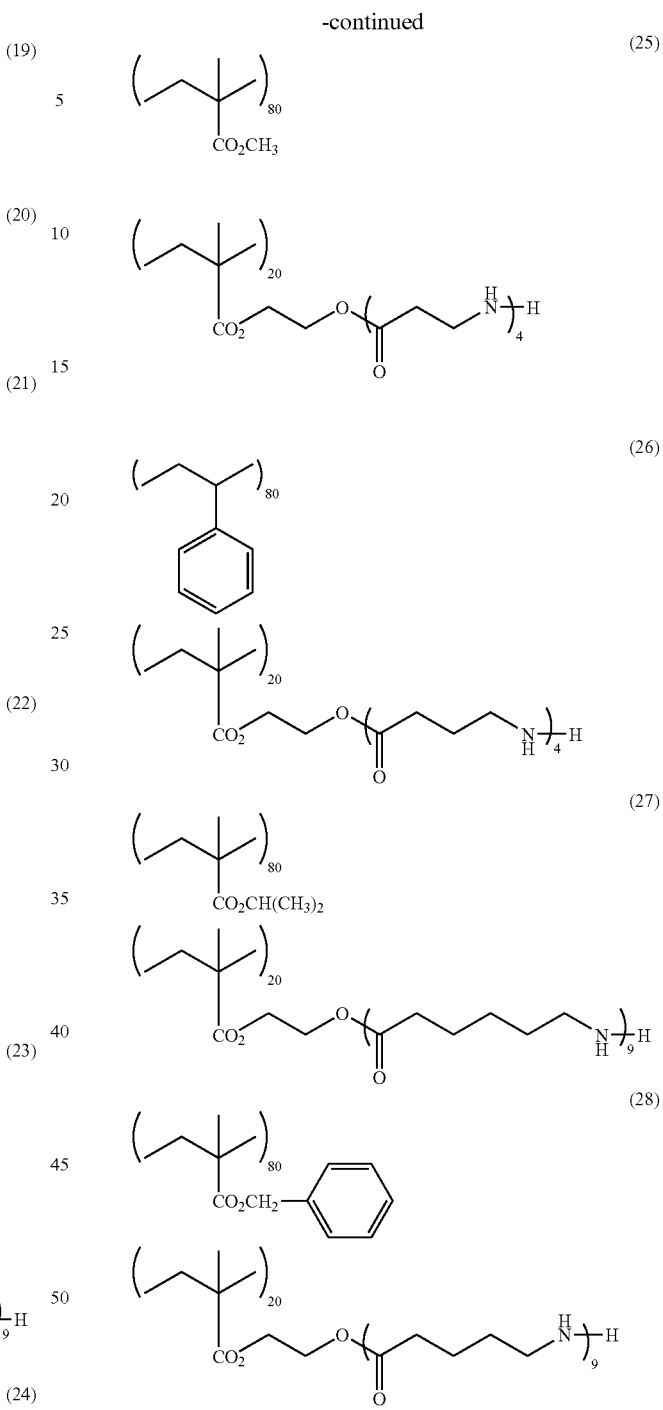

Now, each of the constituting components other than the above-described binder polymer in the photopolymerizing layer used in the lithographic printing plate precursor of the invention will be described below.

[Infrared Absorbing Agent]

In the case of conducting image formation of the lithographic printing plate precursor of the invention by a laser light source emitting infrared ray of from 760 to 1,200 nm, it is preferred that an infrared absorbing agent is incorporated into the photopolymerizing layer. The infrared absorbing agent has a function of converting an infrared ray absorbed to heat. By the heat thus-generated, a polymerization initiator (radical generator) described hereinafter is thermally decomposed to generate a radical. The infrared absorbing agent for use in the invention includes a dye and pigment each having an absorption maximum at a wavelength of from 760 to 1,200 nm.

As a dye for use as the infrared absorbing agent, commercially available dyes and known dyes described in literatures, for example, *Senryo Binran* (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Preferred examples of the dye include cyanine dyes described, for example, in JP-A-58-125246, JP-A-59-84356 and JP-A-60-78787; methine dyes described, for example, in JP-A-58-173696, JP-A-58-181690 and JP-A-58-194595; naphthoquinone dyes described, for example, in JP-A-58-112793, JP-A-58-224793, JP-A-59-48187, JP-A-59-73996, JP-A-60-52940 and JP-A-60-63744; squarylium dyes described, for example, in JP-A-58-112792; and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 (the term "JP-B" as used herein means an "examined Japanese patent publication") are also preferably used. Other preferred examples of the dye include near infrared absorbing dyes represented by formulae (I) and (II) in U.S. Pat. No. 4,756,993.

Other preferred examples of the infrared absorbing dye according to the invention include specific indolenine cyanine dyes described in JP-A-2002-278057 as illustrated below.

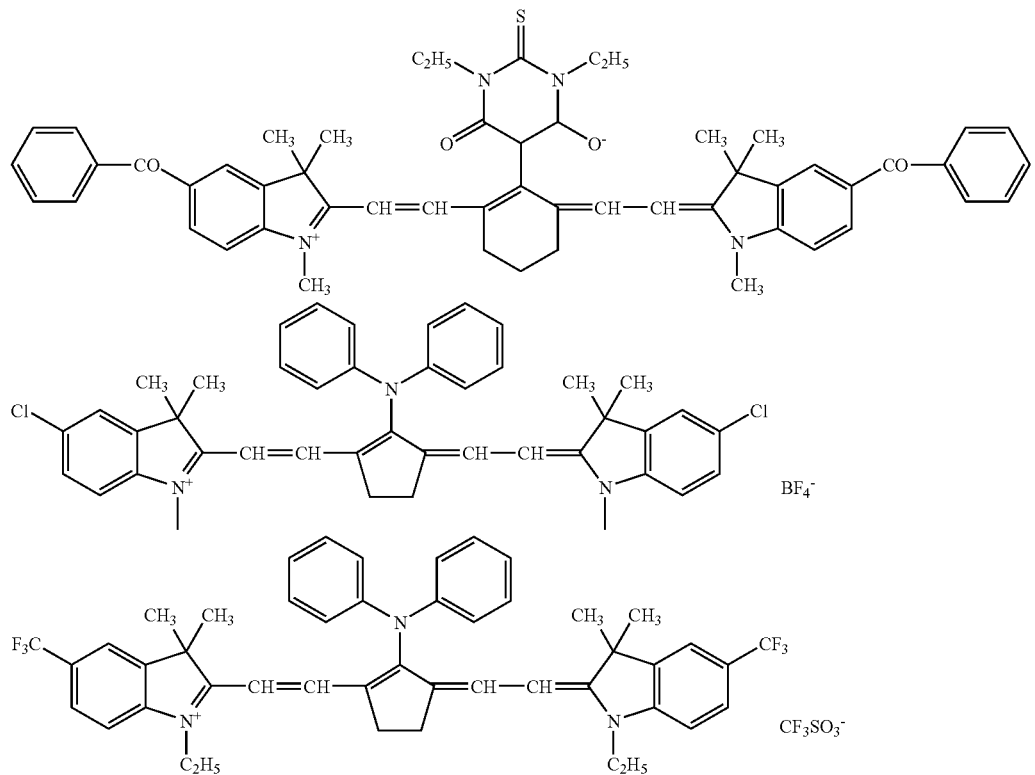

Of the dyes, cyanine dyes, squarylium dyes, pyrylium dyes, nickel thiolate complexes and indolenine cyanine dyes are particularly preferred. Cyanine dyes and indolenine cyanine dyes are more preferred. As a particularly preferred example of the dye, a cyanine dye represented by the following formula (i) is exemplified.

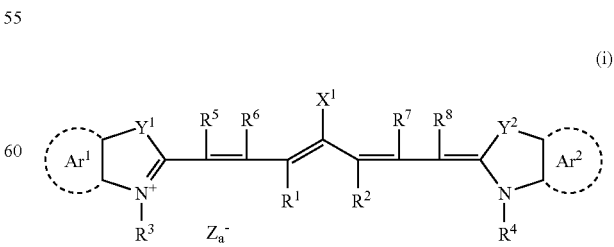

(i)

In formula (i), $X^1$ represents a hydrogen atom, a halogen atom, $-NPh_2$, $X^2-L^1$ or a group shown below:

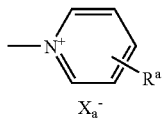

wherein $X_a^-$ has the same meaning as $Z_a^-$ defined hereinafter, and $R^a$ represents a hydrogen atom, an alkyl group, an aryl group, a substituted or unsubstituted amino group or a halogen atom.

$X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates a nitrogen atom, a sulfur atom, an oxygen atom, a halogen atom or a selenium atom, In formula (i), $R^1$ and $R^2$ each independently represents a hydrocarbon group having from 1 to 12 carbon atoms. In view of the preservation stability of a coating solution for photopolymerizing layer, it is preferred that $R^1$ and $R^2$ each represents a hydrocarbon group having two or more carbon atoms, and particularly preferably, $R^1$ and $R^2$ are combined with each other to form a 5-membered or 6-membered ring.

$Ar^1$ and $Ar^2$, which may be the same or different, each represents an aromatic hydrocarbon group, which may have a substituent. Preferred examples of the aromatic hydrocarbon group include a benzene ring and a naphthalene ring. Also, preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$ which may be the same or different, each represents a hydrocarbon group having 20 or less carbon atoms, which may have a substituent. Preferred examples of the substituent include an alkoxy group having 12 or less carbon atoms, a carboxy group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (i) has an anionic substituent in the structure thereof so that neutralization of charge is not needed. Preferred examples of the counter ion for $Za^-$ include a halogen ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of preservation stability of a coating solution for photopolymerizing layer.

Specific examples of the cyanine dye represented by formula (i), which can be preferably used in the invention, include those described in paragraphs [0017] to [0019] of JP-A-2001-133969.

Further, other particularly preferred examples include specific indolenine cyanine dyes described in JP-A-2002-278057 described above.

Examples of the pigment used in the invention include commercially available pigments and pigments described in Colour Index (C.I.), Saishin Ganryo Binran (Handbook of Newest Pigments) compiled by Pigment Technology Society of Japan (1977), Saishin Ganryo Oyou Gijutsu (Newest Application Technologies of Pigments), CMC Publishing Co., Ltd. (1986) and Insatsu Ink Gijutsu (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigments include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in Kinzoku Sekken no Seishitsu to Oyo (Properties and Applications of Metal Soap), Saiwai Shobo, Insatsu Ink Gijutsu (Printing Ink Technology), CMC Publishing Co., Ltd. (1984), and Saishin Ganryo Oyo Gijutsu (Newest Application Technologies of Pigments), CMC Publishing Co., Ltd. (1986).

The pigment has a particle size of preferably from 0.01 to 10 μm, more preferably from 0.05 to 1 μm, particularly preferably from 0.1 to 1 μm. In the above-described range, good stability of the pigment dispersion in a coating solution for photopolymerizing layer and good uniformity of the photopolymerizing layer can be obtained.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in Saishin Ganryo Oyo Gijutsu (Newest Application Technologies of Pigments), CMC Publishing Co., Ltd. (1986).

The infrared absorbing agent may be added together with other components to one layer or may be added to a different layer separately provided.

With respect to an amount of the infrared absorbing agent added, in the case of preparing a lithographic printing plate precursor, the amount is so controlled that absorbance of the photopolymerizing layer at the maximum absorption wavelength in the wavelength region of from 760 to 1,200 nm measured by reflection measurement is ordinarily in a range of from 0.3 to 1.2, preferably in a range of from 0.4 to 1.1. In the above-described range, the polymerization reaction proceeds uniformly in the thickness direction of the photopolymerizing layer and good film strength of the image area and good adhesion of the image area to a support are achieved.

The absorbance of the photopolymerizing layer can be controlled depending on the amount of the infrared absorbing agent added to the photopolymerizing layer and the thickness of the photopolymerizing layer. The measurement of the absorbance can be carried out in a conventional manner. The method for measurement includes, for example, a method of forming a photopolymerizing layer having a thickness determined appropriately in the range necessary for the lithographic printing plate precursor on a reflective support, for example, an aluminum plate, and measuring reflection density of the photopolymerizing layer by an optical densitometer or a spectrophotometer according to a reflection method using an integrating sphere.

[Polymerization Initiator]

The polymerization initiator for use in the photopolymerizing layer according to the invention can be appropriately selected from various kinds of known photopolymerization initiators or combination systems of two or more photopolymerization initiators (photopolymerization initiation systems) described in patents and literature depending on a wavelength of a light source to be used.

In the case of using as the light source, a blue semiconductor laser, an Ar laser, a second harmonic of an infrared semiconductor laser or an SHG-YAG laser, various photopolymerization initiators (systems) have been proposed. For instance, a certain kind of photo-reducing dyes, for example, Rose Bengal, Eosin or Erythrosine as described in U.S. Pat. No. 2,850,445, and a combination system comprising a dye and an initiator, for example, a composite initiator system comprising a dye and an amine as described in JP-B-44-20189, a combination system of a hexaarylbiimidazole, a radical generator and a dye as described in JP-B-45-37377, a combination system of a hexaarylbiimidazole and a p-dialkylaminobenzylidene kotone as described in JP-B-47-2528 and JP-A-54-155292, a combination system of a cyclic cis-α-dicarbonyl compound and a dye as described in JP-A-48-84183, a combination system of a cyclic triazine and a merocyanine dye as described in JP-A-54-151024, a combination system of a 3-ketocoumarin and an activator as described in JP-A-52-112681 and JP-A-58-15503, a combination system of a biimidazole, a styrene derivative and a thiol as described in JP-A-59-140203, a combination system of an organic peroxide and a dye as described in JP-A-59-1504, JP-A-59-140203, JP-A-59-189340, JP-A-62-174203, JP-B-62-164J and U.S. Pat. No. 4,766,055, a combination system of a dye and an active halogen compound as described in JP-A-63-178105, JP-A-63-258903 and JP-A-3-264771, a combination system of a dye and a borate compound as described in JP-A-62-143044, JP-A-62-150242, JP-A-64-13140, JP-A-64-13141, JP-A-64-13142, JP-A-64-13143, JP-A64-13144, JP-A-64-17048, JP-A-1-229003, JP-A-1-298348 and JP-A-1-138204, a combination system of a dye having a rhodanine ring and a radical generator as described in JP-A-2-179643 and JP-A-2-244050, a combination system of a titanocene and a 3-ketocoumarin dye as described in JP-A-63-221110, a combination system of a titanocene, a xanthene dye and an addition-polymerizable ethylenically unsaturated compound having an amino group or a urethane group as described in JP-A4-221958 and JP-A4-219756, a combination system of a titanocene and a specific merocyanine dye as described in JP-A-6-295061, and a combination system of a titanocene and a dye having a benzopyran ring as described in JP-A-8-334897 are exemplified.

Particularly preferred photopolymerization initiators (systems) for use in the photopolymerizing layer (photosensitive layer) of the lithographic printing plate precursor of the invention contain at least one kind of titanocene compounds. The titanocene compound used as the photopolymerzation initiator (system) in the invention may be any titanocene compound capable of generating an active radical, when exposed to light in the coexistence with a sensitizing dye described hereinafter. The titanocene compound used can be appropriately selected from known compounds described, for example, in JP-A-59-152396, JP-A-61-151197, JP-A-6341483, JP-A-63-41484, JP-A-2-249, JP-A-2-291, JP-A-3-27393, JP-A-3-12403 and JP-A-6-41170.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophn-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6tetrafluorophen-1-yl, dimethylcyclopentadienyl-Ti-bis-2,4-difluorophen-1-yl and bis(cyclopentadienyl)-bis-(2,6-difluoro-3-(pyr-1-lyl)phenyl)titanium.

The polymerization initiator can be subjected to various chemical modifications for further improving characteristics of the photosensitive layer. Methods, for example, connection to a sensitizing dye or to a radical-generating part, for example, an addition polymerizable unsaturated compound, introduction of a hydrophilic moiety, introduction of a substituent for improving compatibility or restraining deposition of crystals introduction of a substituent for improving an adhesion property and polymerization can be utilized.

With respect to a method of using the titanocene compound, a suitable method can be appropriately selected depending upon the designed performances of the lithographic printing plate precursor similar to the addition polymerizable compound described hereinafter. For instance, compatibility with the photosensitive layer can be enhanced by using two or more of the titanocene compounds in combination. As to an amount of the photopolymerization initiator, for example, titanocene compound used, a large amount of the photopolymerization initiator is ordinarily more advantageous in view of the sensitivity. A sufficient sensitivity can be obtained by using the photopolymerization initiator in an amount of from 0.5 to 80 parts by weight, preferably from 1 to 50 parts by weight, per 100 parts by weight of the nonvolatile component of the photosensitive layer. On the other hand, when the lithographic printing plate precursor is used under a yellow larnp or a white lamp, it is preferred that the amount of the titanocene compound is small in order to prevent the formation of fog due to light of approximately 500 nm. By using the titanocene compound in combination with a sensitizing dye, a sufficient sensitivity can be achieved even when the amount of the titanocene compound is reduced to as small as 6 parts by weight or less, further 1.9 parts by weight or less, still further 1.4 parts by weight or less, per 100 parts by weight of the nonvolatile component of the photosensitive layer.

As a heat-polymerization initiator for initiating or advancing a curing reaction of the addition polymerizable compound described hereinafter used in the invention, a radical generator of a thermal decomposable type, which is decomposed by heat to generate a radical, is useful. In a system where such a radical generator is used together with the infrared absorbing agent described above, the infrared absorbing agent generates heat upon irradiation of an infrared laser and by the heat a radical is formed, thereby enabling recording with such a combination use.

Examples of the radical generator include an onium salt, a triazine compound having a trihalomnethyl group, a peroxide, an azo-type polymerization initiator, an azide compound, a quinonediazide, an oxime ester compound and a triaryl monoalkyl borate compound. Of the compounds, the onium salt and oxime ester compound are preferred because of high sensitivity. The onium salt that is preferably used as the polymerization initiator in the invention is described below. Preferred examples of the onium salt include an iodoniurn salt, a diazonium salt and a sulfonium salt. In the invention, the onium salt functions not as an acid generator but as an initiator of radical polymerization. The onium salts preferably used in the invention include onium salts represented by the following formulae (A) to (C).

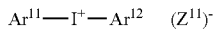 (A)

 (B)

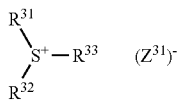 (C)

In formula (A), $Ar^{11}$ and $Ar^{12}$ each independently represents an aryl group having 20 or less carbon atoms, which may have a substituent. When the aryl group has a substituent, preferred examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from a halogen ion, a perchlorate ion, a tetrafluoroborate ion, hexafluorophosphate ion, a carboxylate ion and a sulfonate ion and, and is preferably a perchlorate ion, a hexafluorophosphate ion, a carboxylate ion or an arylsulfonate ion.

In formula (B), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms. $Z^{21-}$ represents a counter ion having the same meaning as defined for $Z^{11-}$.

In formula (C), $R^{31}$, $R^{32}$ and $R^{33}$, which may be the same or different, each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms and an aryloxy group having 12 or less carbon atoms. $Z^{31-}$ represents a counter ion having the same meaning as defined for $Z^{11-}$.

Specific examples of the onium salts, which can be preferably used as the polymerization initiator (radical generator) in the invention, include onium salts described in JP-A-2001-133696. Specific examples of the onium salts ([OI-1] to [OI-10]) represented by formula (A), the onium salts ([ON-1] to [ON-5]) represented by formula (B), and the onium salts ([OS-1] to [OS-7)) represented by formula (C), which can be preferably used in the invention, are set forth below but the invention should not be construed as being limited thereto.

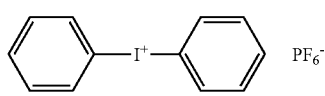

[OI-1]

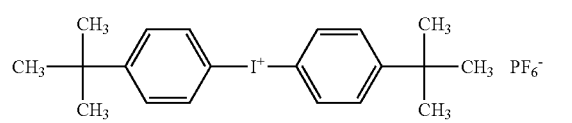

[OI-2]

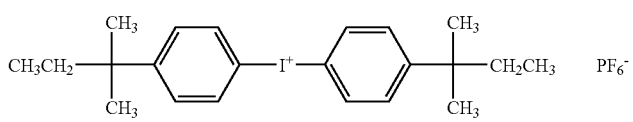

[OI-3]

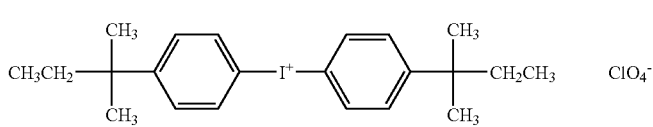

[OI-4]

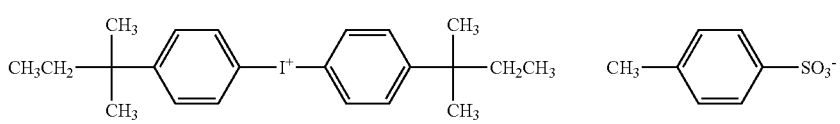

[OI-5]

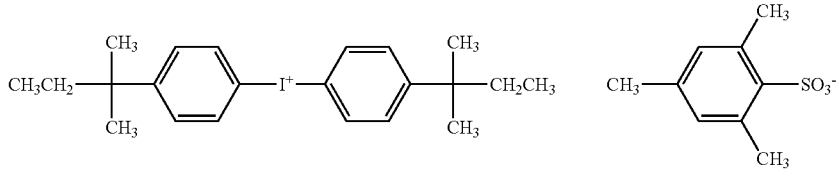

[OI-6]

-continued
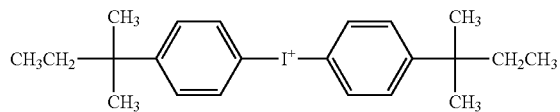 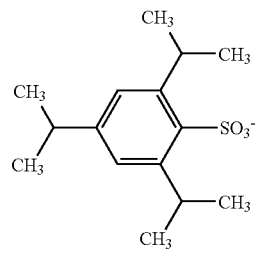 [OI-7]
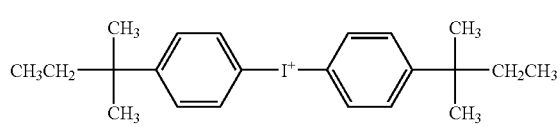 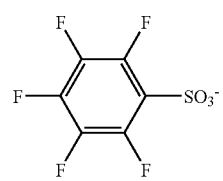 [OI-8]
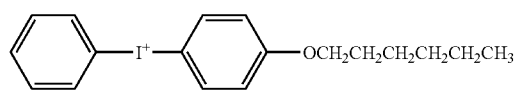 [OI-9]
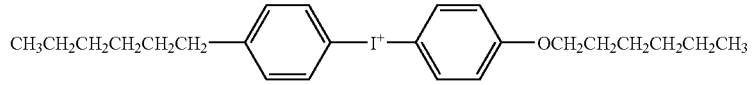 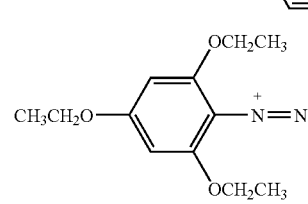 [OI-10]
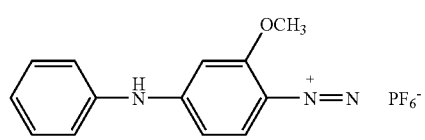  [ON-1]
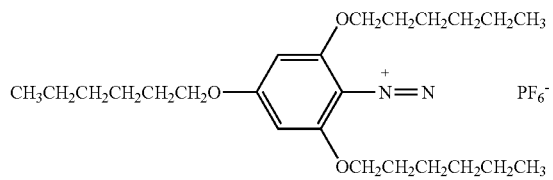 [ON-2]
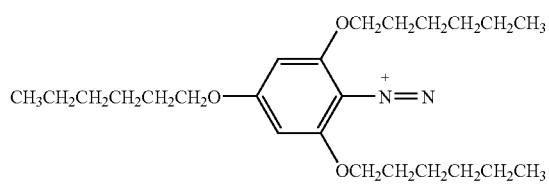 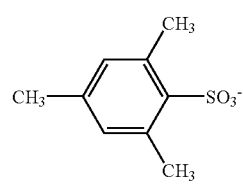 [ON-3]
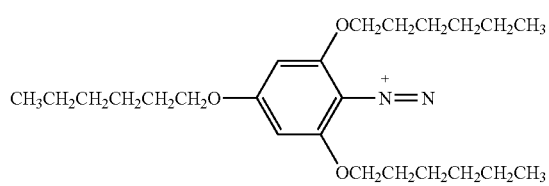 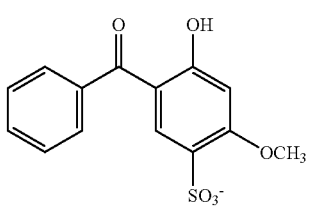 [ON-4]
[ON-5]
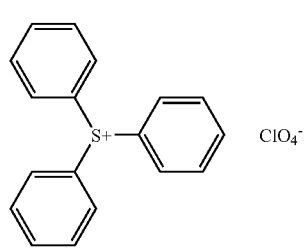 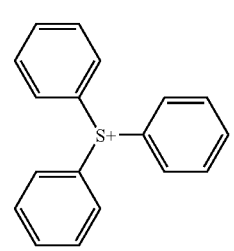 [OS-1]
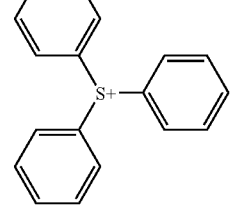 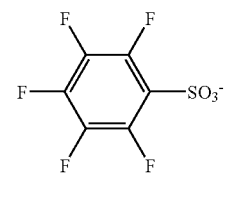 [OS-2]

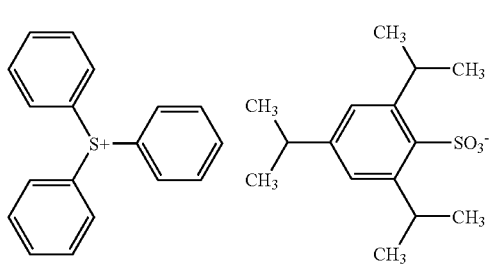
[OS-3]

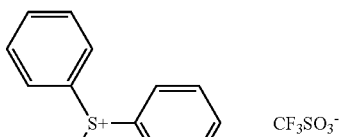
[OS-4]

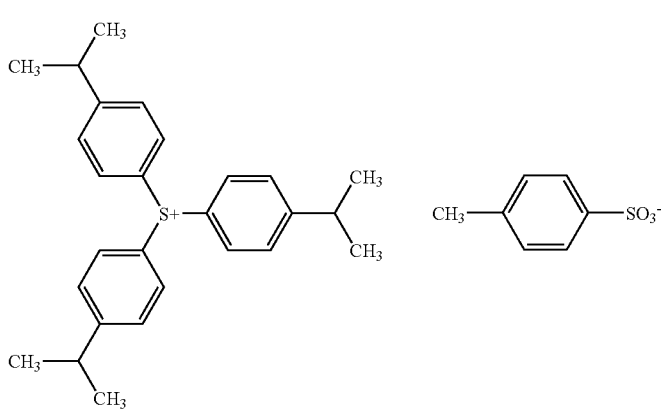

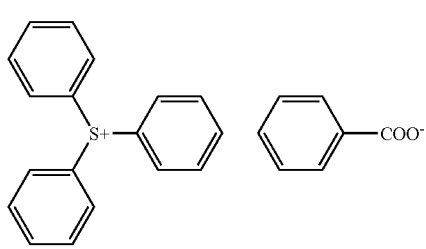
[OS-5]

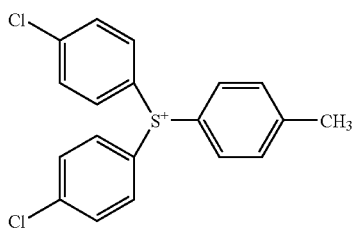
[OS-6]

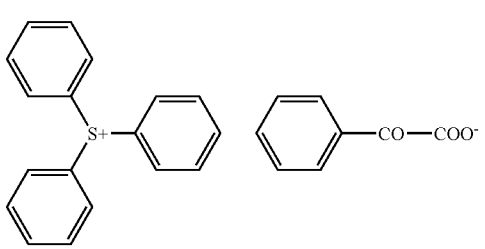
[OS-7]

The polymerization initiator for use in the invention preferably has the maximum absorption wavelength of 400 nm or shorter, and more preferably 360 nm or shorter. By controlling the absorption wavelength to an ultraviolet region, handling of the lithographic printing plate precursor can be performed under a white lamp.

Further, other preferred examples of the polymerization initiator include specific aromatic sulfonium salts described in JP-A-2002-148790, 3JP-A-2001-343742 and JP-A-2002-6482.

Representative examples of other preferred polymerization initiators for use in the invention are set forth below.

-continued

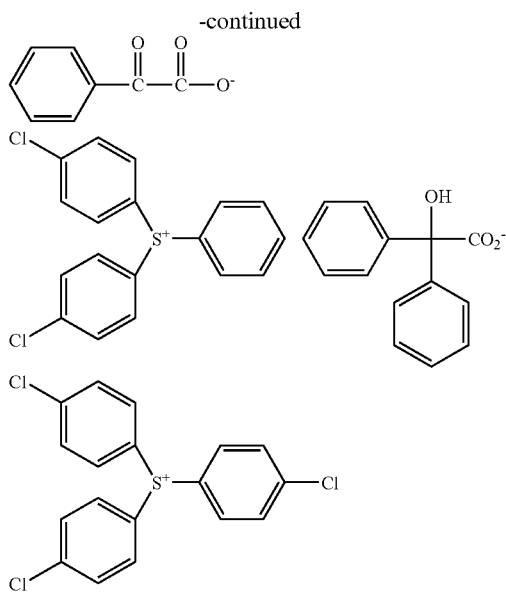

-continued

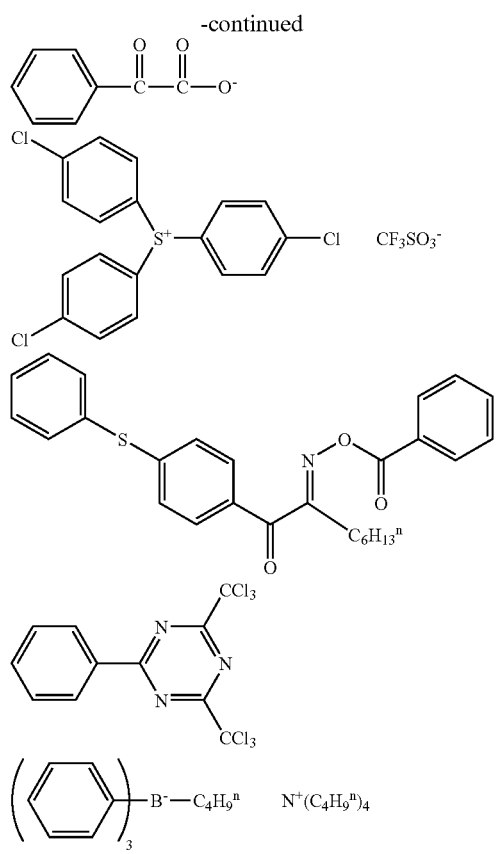

Now, the oxime ester compound, which can be preferably used as the polymerization initiator in the invention, is described below. Preferred examples of the oxime ester compound include compounds represented by the following formula (D).

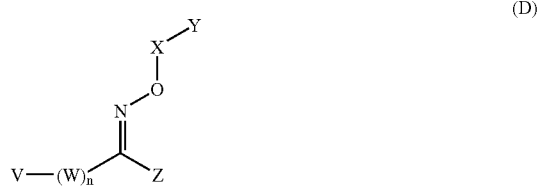

In formula (D), X represents a carbonyl group, a sulfone group or a sulfoxide group. Y represents a cyclic or chain alkyl group having from 1 to 12 carbon atoms, an alkenyl group having from 2 to 12 carbon atoms, an alkenyl group having from 2 to 12 carbon atoms, an aryl group having from 6 to 18 carbon atoms or a heterocyclic group, The aryl group includes an aromatic hydrocarbon group, for example, a benzene ring, a naphthalene ring, an anthracene ring, a phenanthrene group, a pyrene group or a triphenylene group, and the heterocyclic group includes an aromatic compound having at least one of a nitrogen atom, a sulfur atom and an oxygen atom in the cyclic structure thereof, for example, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acrydine group, a phenoxazine group and a phenothiazine group. The group represented by Y may be substituted with a halogen atom, a hydroxy group, a nitrile group, a nitro group, a carboxy group, an aldehyde group, an alkyl group, a thiol group, an aryl group, an alkenyl group, an alkenyl group, an ether group, an ester group, a urea group, an amino group, an amido group, a sulfido group, a disulfido group, a sulfoxido group, a sulfo group, a sulfone group, a hydrazine group, a carbonyl group, an imino group, a halogen atom, a hydroxy group, a nitrile group, a nitro group, a carboxy group, a carbonyl group, a urethane group, an alkyl group, a thiol group, an aryl group, a phophoro group, a phospho group or a carbonyl ether group.

In formula (D), Z has the same meaning as Y or represents a nirtile group, a halogen atom, a hydrogen atom or an amino group, The group represented by Z may be substituted with a halogen atom, a hydroxy group, a nitrile group, a nitro group, a carboxy group, an aldehyde group, an alkyl group, a thiol group, an aryl group, an alkenyl group, an alkenyl group, an ether group, an ester group, a urea group, an amino group, an amido group, a sulfido group, a disulfido group, a sulfoxido group, a sulfo group, a sulfone group, a bydrazine group, a carbonyl group, an imino group, a halogen atom, a hydroxy group, a nitrile group, a nitro group, a carboxy group, a carbonyl group, a urethane group, an alkyl group, a thiol group, an aryl group, a phophoro group, a phospho group or a carbonyl ether group.

In formula (D), W represents a divalent organic group, for example, a methylene group, a carbonyl group, a sulfoxido group, a sulfone group or an inino group. The methylene group and imino group may be each substituted with an alkyl group, an aryl group, an ester group, a nitrile group, a carbonyl ether group, a sulfo group, a sulfo ether group or an ether group. n represents an integer of 0 or 1.

In formula (D), V represents a cyclic or chain alkyl group having from 1 to 12 carbon atoms, an alkenyl group having from 2 to 12 carbon atoms, an alkynyl group having from 2 to 12 carbon atoms, an aryl group having from 6 to 18 carbon atoms, an alkoxy group or an aryloxy group. The aryl group includes an aromatic hydrocarbon group, for example, a benzene ring, a naphthalene ring, an anthracene ring, a phenanthrene group, a pyrene group or a triphenylene group, and a betero atom-containing aromatic compound, for example, a pyrrole group, a furan group, a thiophene group, a selenophene group, a pyrazole group, an imidazole group, a triazole group, a tetrazole group, an oxazole group, a thiazole group, an indole group, a benzofluran group, a benzimidazole group, a benzoxazole group, a benzothiazole group, a pyridine group, a pyrinidine group, a pyrazine group, a triazine group, a quinoline group, a carbazole group, an acrydine group, a phenoxazine group and a phenothiazine group. The group represented by V may be substituted with a halogen atom, a hydroxy group, a nitrile group, a nitro group, a carboxy-group, an aldehyde group, an alkyl group, a thiol group, an aryl group, an alkenyl group, an alkynyl group, an ether group, an ester group, a urea group, an amino group, an amido group, a sulfido group, a disulfido group, a sulfoxido group, a sulfo group, a sulfone group, a hydrazine group, a carbonyl group, an imino group, a halogen atom, a hydroxy group, a nitrile group, a nitro group, a carboxy group, a carbonyl group, a urethane group, an alkyl group, a thiol group, an aryl group, a phophoro group, a phospho group or a carbonyl ether group.

Alternatively, V and Z may be combined with each other to from a ring.

In the oxime ester compounds represented by formula (D), it is preferred that X represents a carbonyl group, Y represents an aryl group or a benzoyl group, Z represents an alkyl group or an aryl group, W represents a carbonyl group and V represents an aryl group in view of sensitivity. It is more preferred that the aryl group represented by V has a thioether substituent.

The structure of N—O bond in formula (D) may be any one of E isomer and Z isomer.

Examples of the oxime ester compound preferably used in the invention include compounds described in *Progress in Organic Coatings*, 13, 123-150 (1985), *J. C S. Perkin II* 1653-1660 (1979), *Journal of Photopolymer Science and Technology*, 205-232 (1995), *J. C. S. Perkin II*, 156-162 (1979), JP-A-2000-66385 and JP-A-2000-80068.

Specific examples of the oxime ester compound preferably used in the invention are set forth below, but the invention should not be construed as being limited thereto.

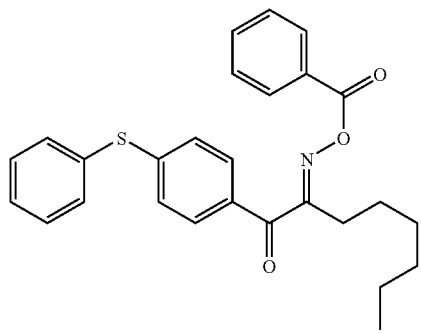

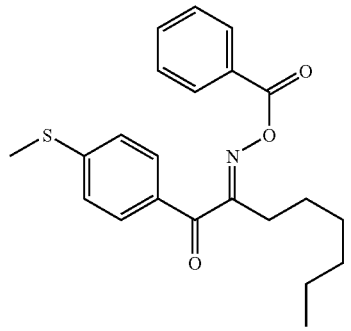

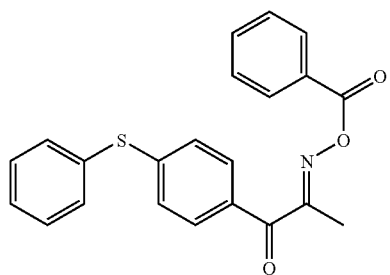

-continued

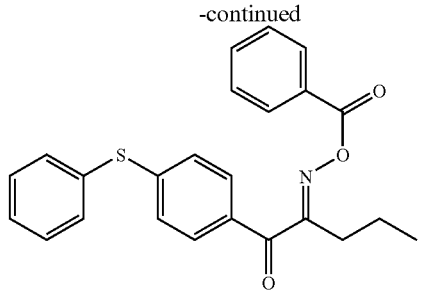

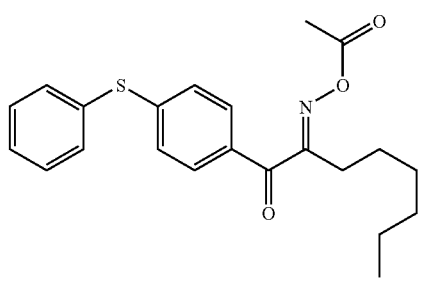

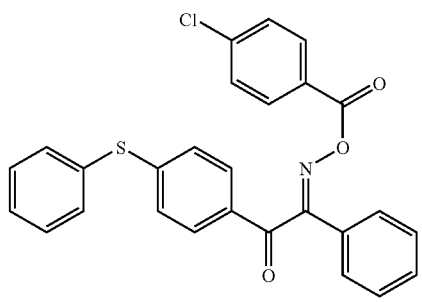

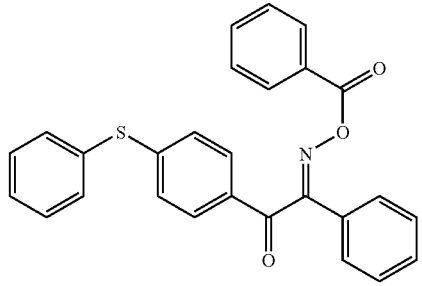

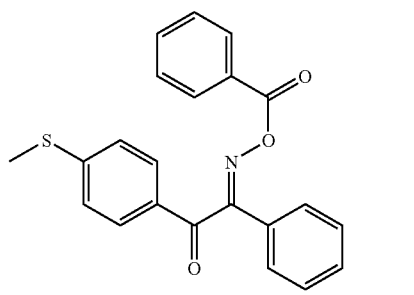

-continued
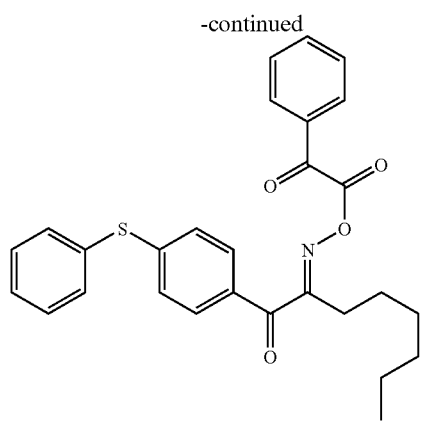
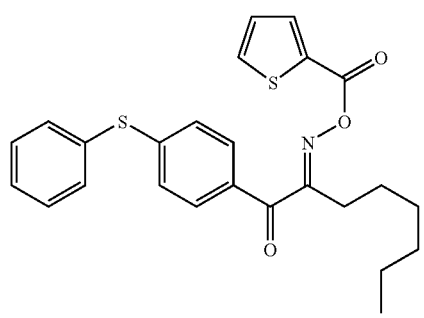
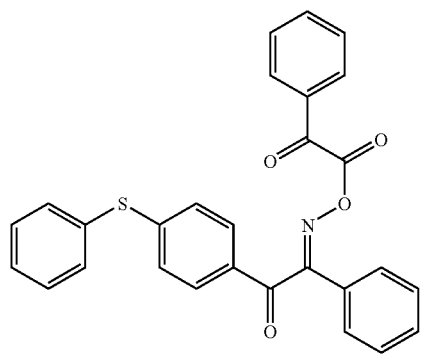
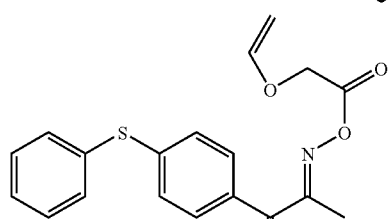
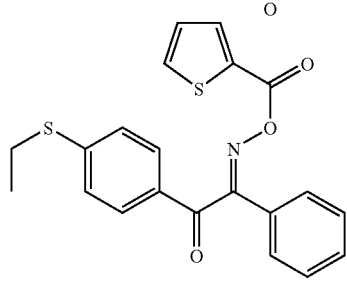
-continued
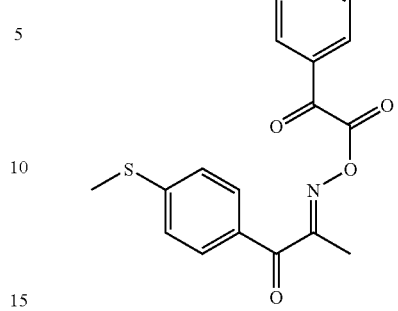
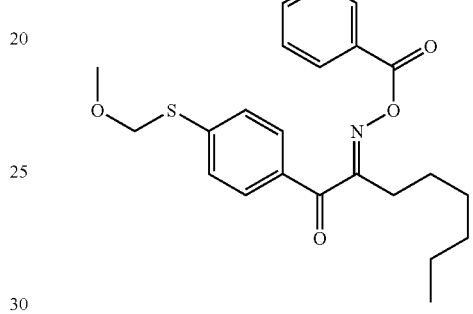
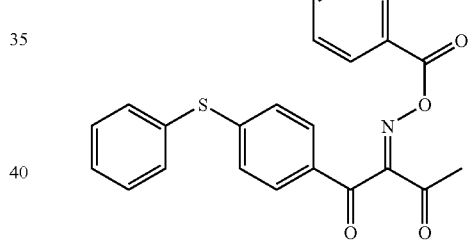
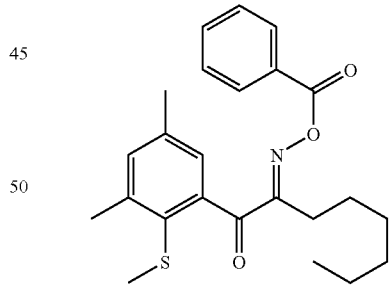
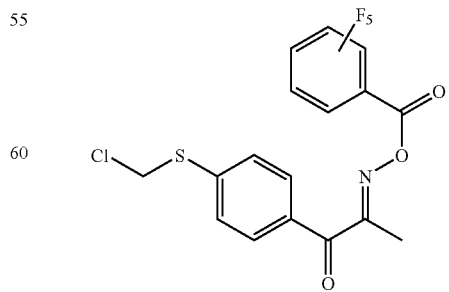

31
-continued
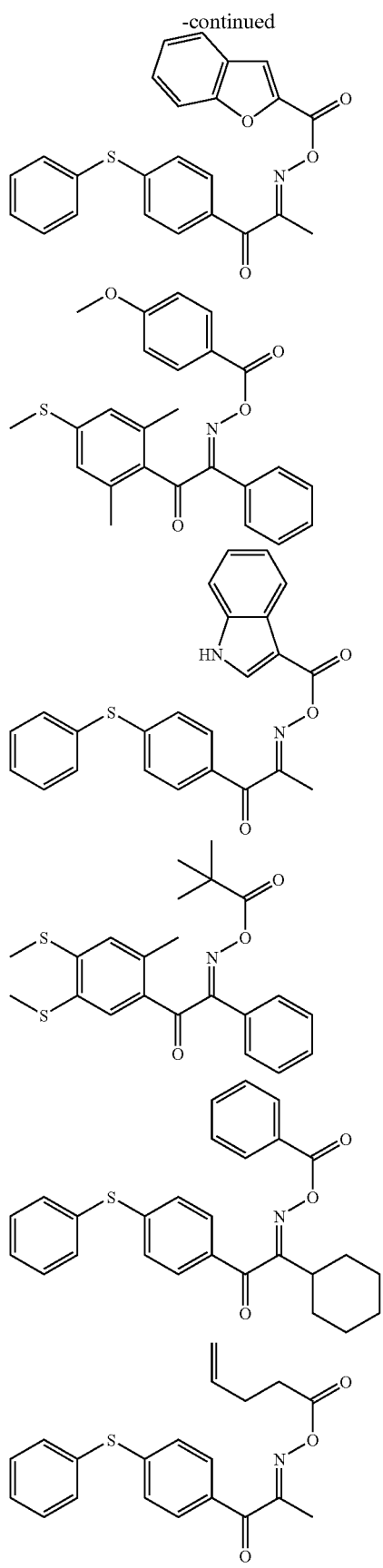
32
-continued
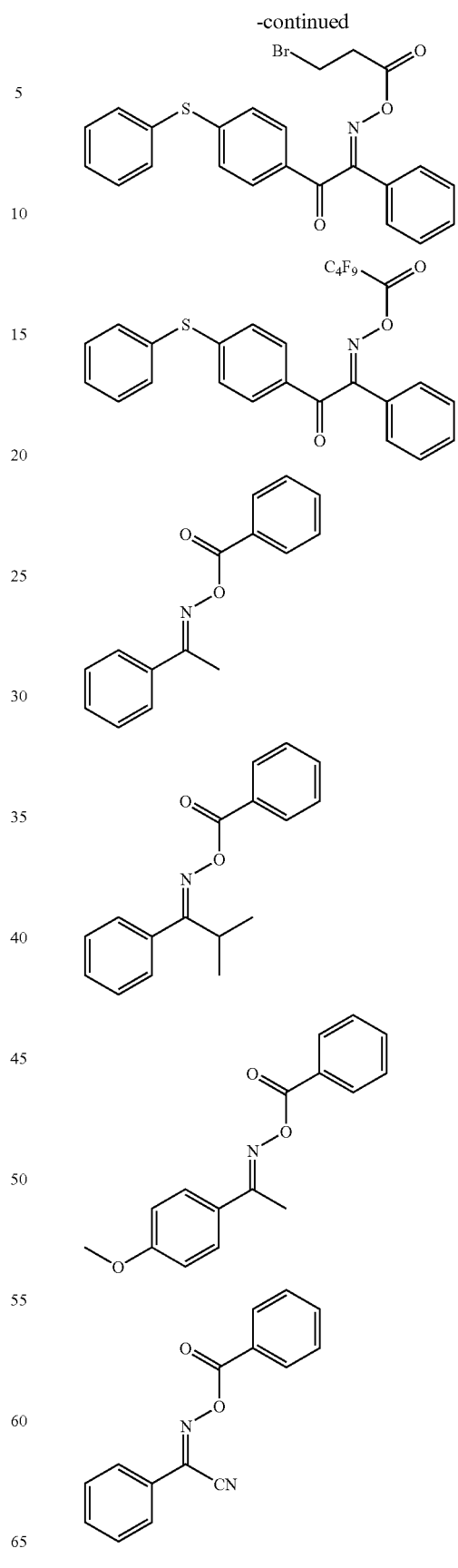

-continued
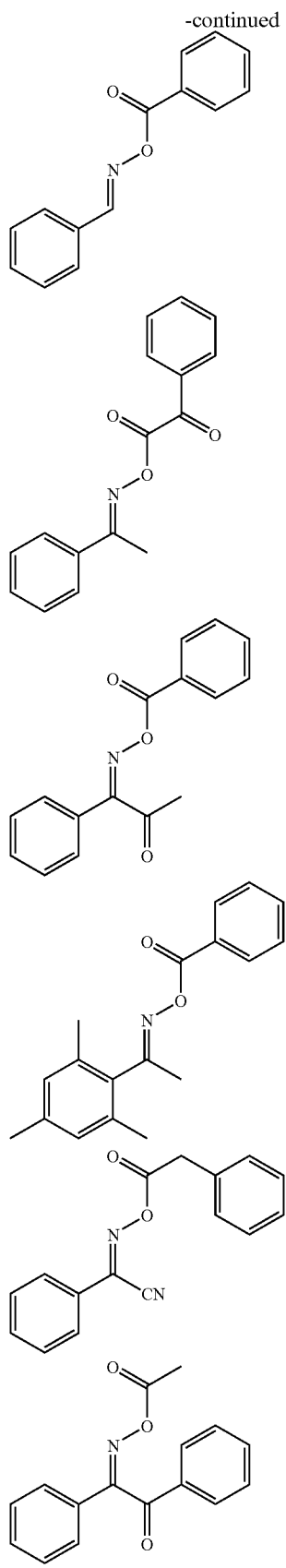
-continued
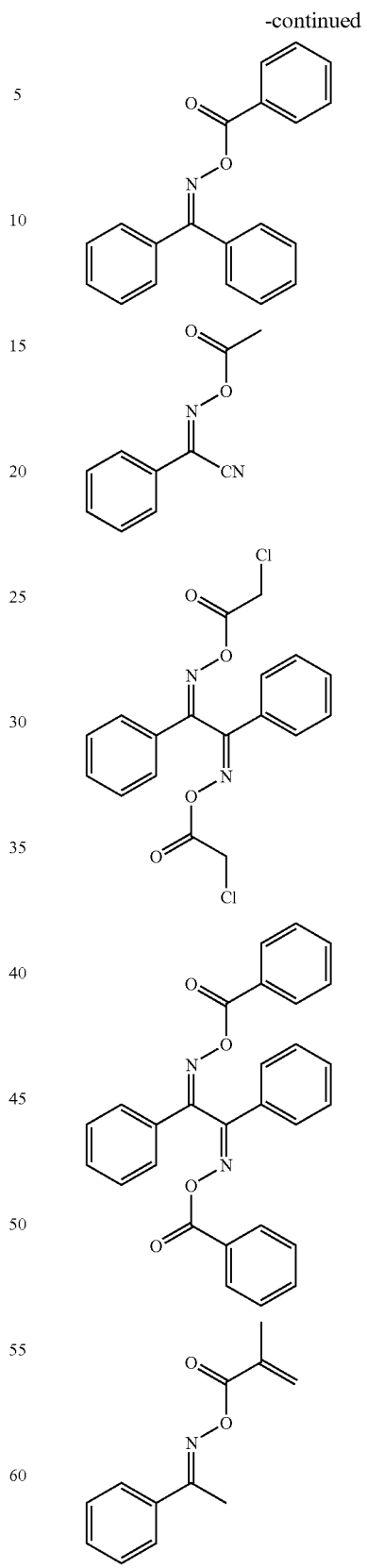

-continued
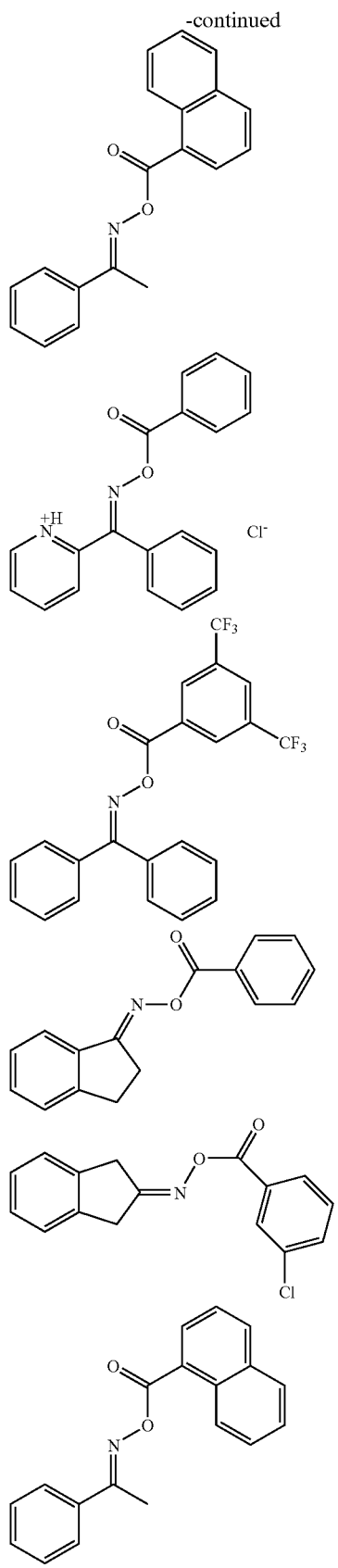
-continued
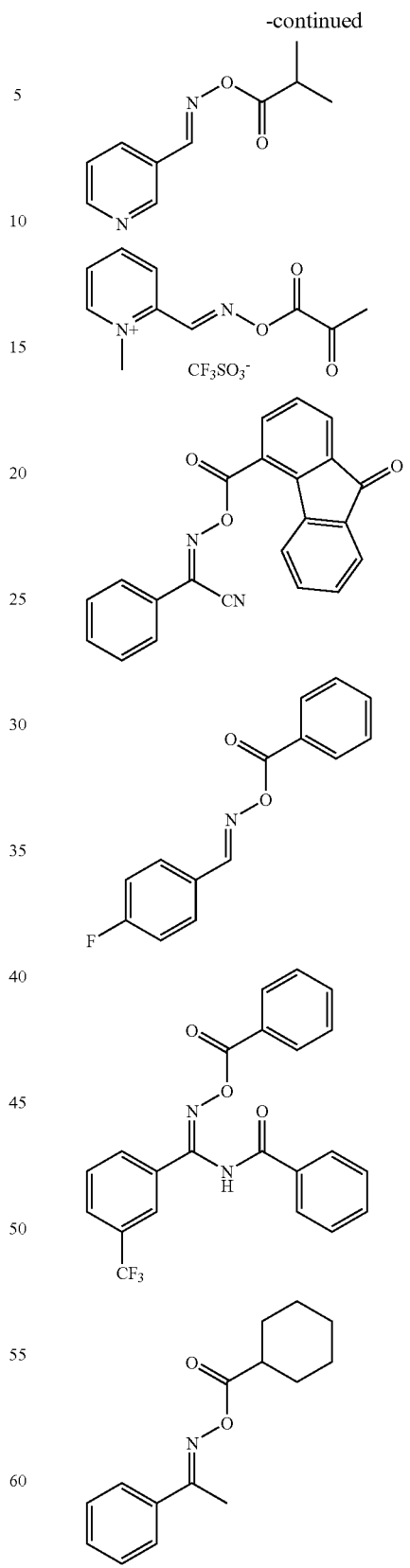

-continued
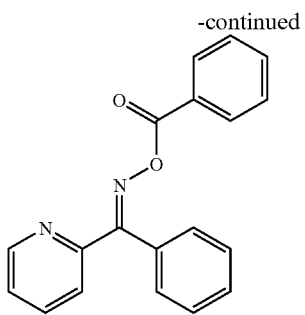
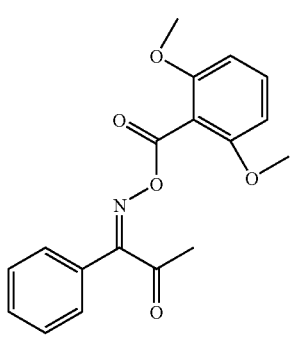
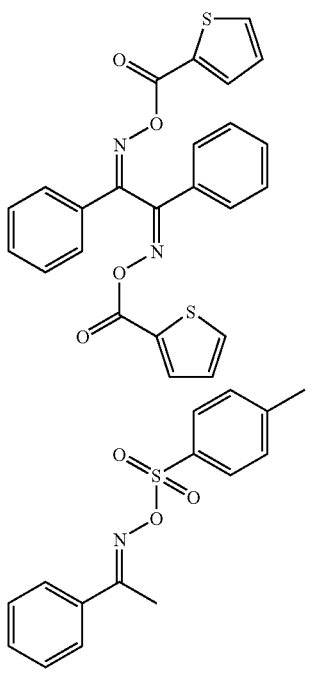
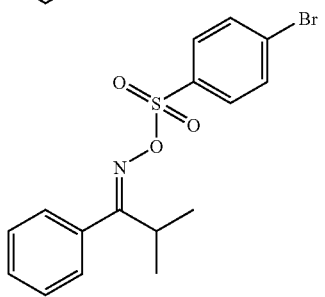
-continued
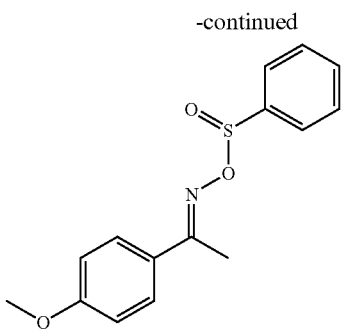
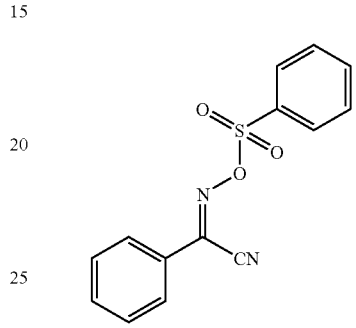
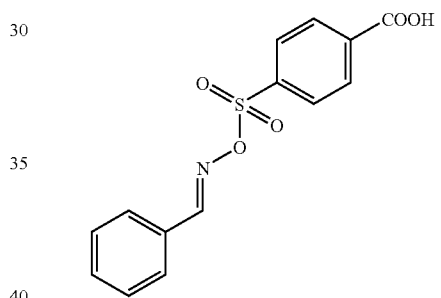
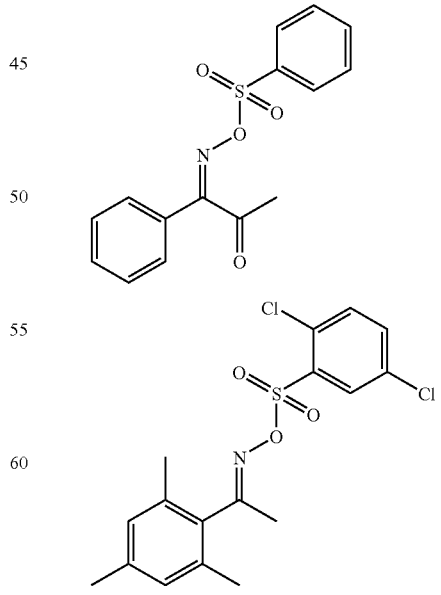

-continued
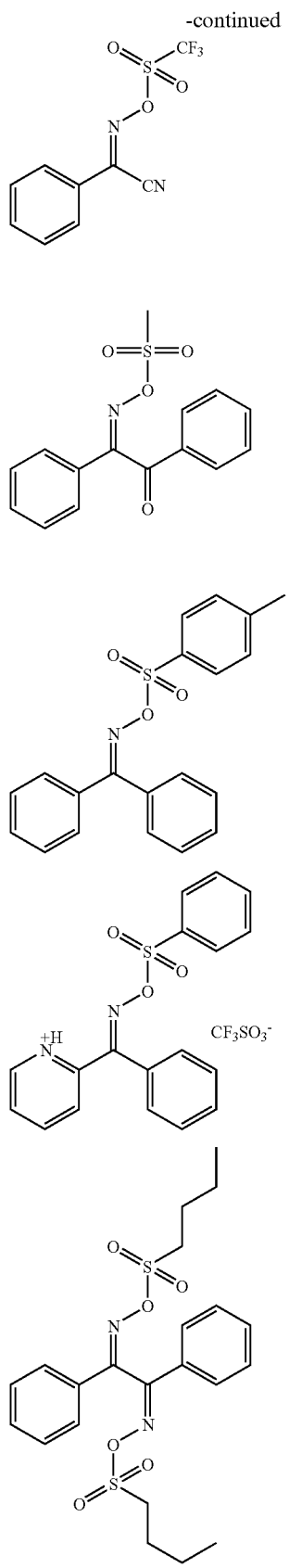
-continued
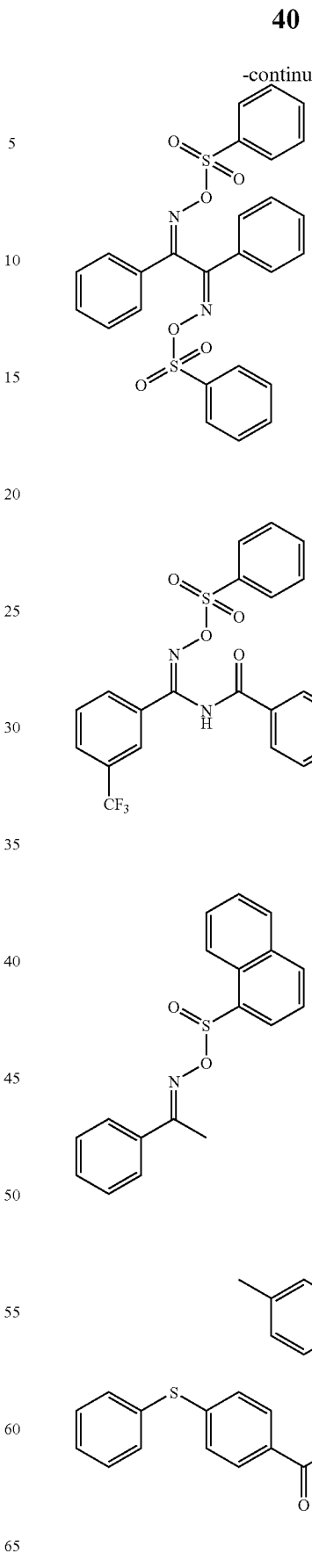

-continued
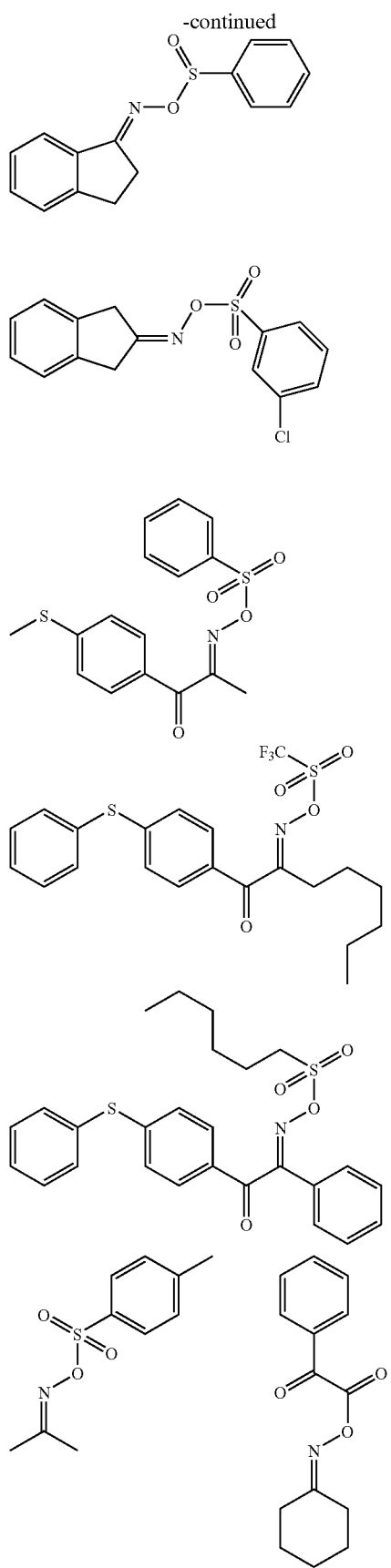
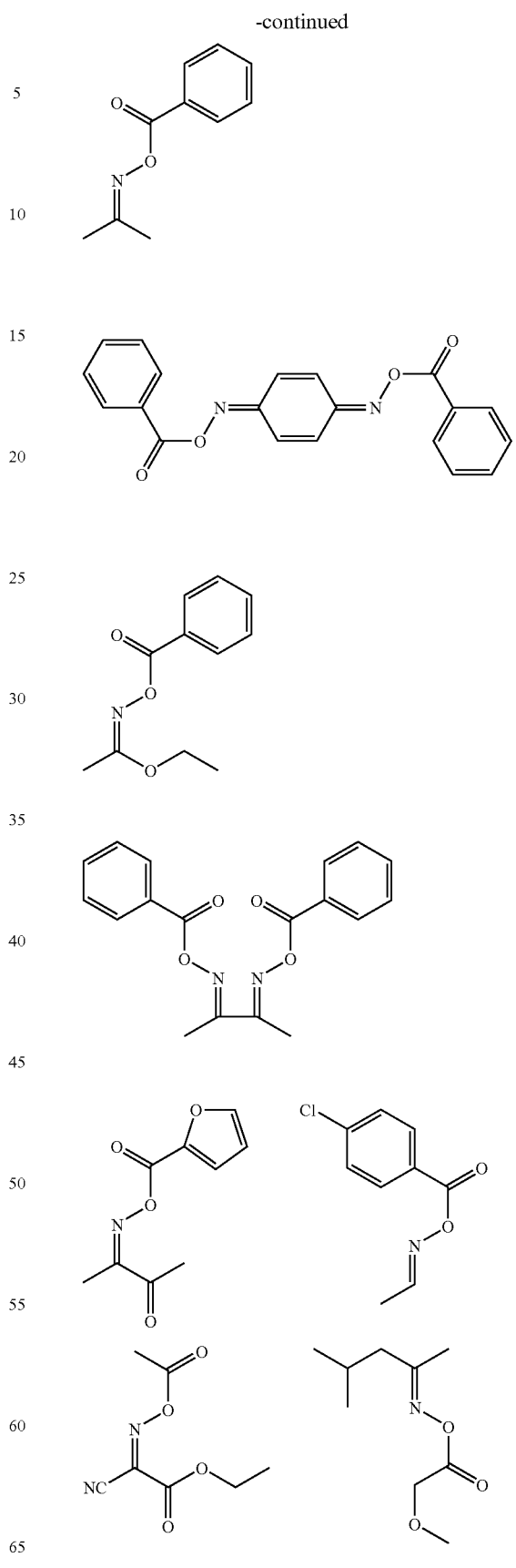

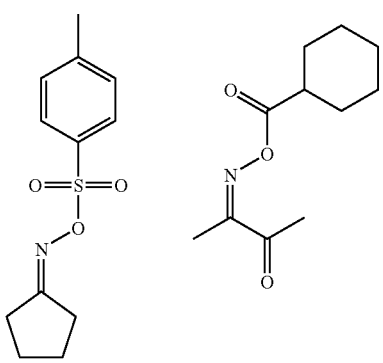
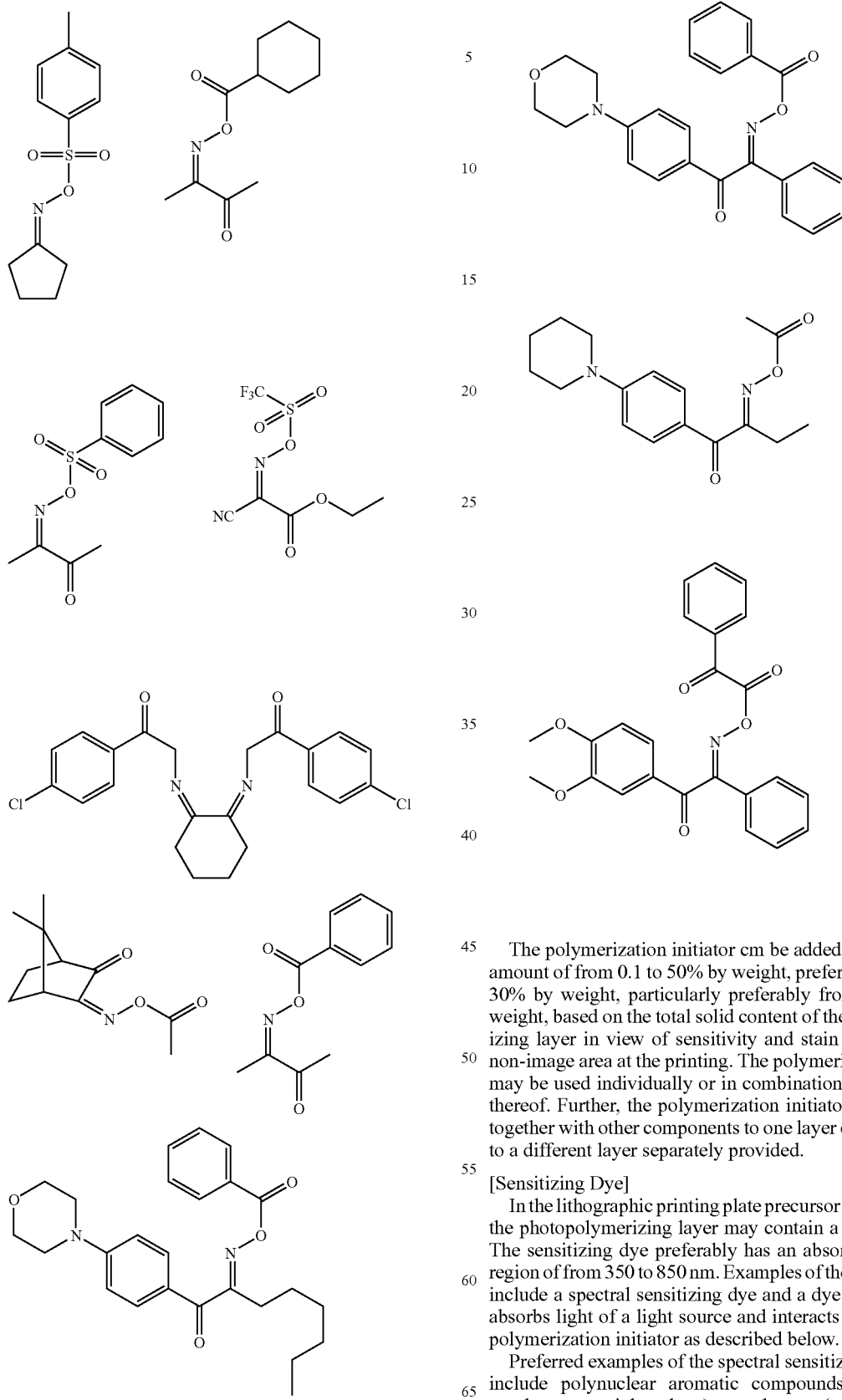

The polymerization initiator cm be added ordinarily in an amount of from 0.1 to 50% by weight, preferably from 0.5 to 30% by weight, particularly preferably from 1 to 20% by weight, based on the total solid content of the photopolymerizing layer in view of sensitivity and stain occurred in the non-image area at the printing. The polymerization initiators may be used individually or in combination of two or more thereof. Further, the polymerization initiator may be added together with other components to one layer or may be added to a different layer separately provided.

[Sensitizing Dye]

In the lithographic printing plate precursor of the invention, the photopolymerizing layer may contain a sensitizing dye. The sensitizing dye preferably has an absorption peak in a region of from 350 to 850 nm. Examples of the sensitizing dye include a spectral sensitizing dye and a dye or pigment that absorbs light of a light source and interacts with the photopolymerization initiator as described below.

Preferred examples of the spectral sensitizing dye and dye include polynuclear aromatic compounds (e.g., pyrene, perylene or triphenylene), xanthenes (e.g., fluorescein, Eosine, Erythrosine, Rhodamine B or Rose Bengale), cyanines (e.g., thiacarbocyanine or oxacarbocyanine), merocyanines (e.g., merocyanine or carbomerocyanine, thiazines (e.g., Thionine, Methylene Blue or Toluidine Blue), acridines (e.g., Acridine Orange, chloroflavine or acriflavine), phthalocyanines (e.g., phthalocyanine or metal phthalocyanine), porphyrins (e.g., tetraphenylporphyrin or center metal-substituted porphyrin), chlorophylls (e.g., chlorophyll, chlorophyllin or center metal-substituted chlorophyll), metal complexes, anthraquinones (e.g., anthraquinone) and squaliums (e.g., squalium).

More preferred examples of the spectral sensitizing dye and dye include styryl dyes as described in JP-B-37-13034, cationic dyes as described in JP-A-62-143044, quinoxalinium salts as described in JP-B-59-24147, new Methylene Blue compounds as described in JP-A-64-33104, anthraquinones as described in JP-A-64-56767, benzoxanthene dyes as described in JP-A-2-1714, acridines as described in JP-A-2-226148 and JP-A-2-226149, pyrylium salts as described in JP-B140-28499, cyanines as described in JP-B-46-42363, benzofuran dyes as described in JP-A-2-63053, conjugated ketone dyes as described in JP-A-2-85858 and JP-A-2-216154, dyes as described in JP-A-57-10605, azocinnamylidene derivatives as described in JP-B-2-30321, cyanine dyes as described in JP-A-1-287105, xanthene dyes as described in JP-A-62-31844, JP-A-62-31848 and JP-A-62-143043, aminostyryl ketones as described in JP-B-59-28325, merocycnine dyes as described in JP-B-61-9621, dyes as described in JP-A-2-179643, nmerocycnine dyes as described in JP-A-2-244050, merocycnine dyes as described in JP-B-59-28326, merocycnine dyes as described in JP-A-59-89803, merocycnine dyes as described in JP-A-8-129257 and benzopyran dyes as described in JP-A-8-334897.

A content of the sensitizing dye is preferably from 0.1 to 50% by weight, more preferably from 0.5 to 30% by weight, and particularly preferably from 1 to 20% by weight, based on the total solid content of the photopolymerizing layer.

[Polymerizable Compound]

The polymerizable compound that can be used in the photopolymerizing layer according to the invention is an addition polymerizable compound having at least one ethylenically unsaturated double bond and it is selected from compounds having at least one, preferably two or more ethylenically unsaturated bonds. Such compounds are widely known in the field of art, and they can be used in the invention without a particular limitation. The polymerizable compound may have a chemical form, for example, a monomer, a prepolymer (i.e., dimmer, trimer or oligomer), a mixture thereof, and a copolymer thereof. Examples of the monomer include unsaturated carboxylic acids (for example, acrylic acid, methacrylic acid, itaconic acid, crotonic acid, isocrotonic acid or maleic acid) and the esters and amides thereof Preferably, an ester between an unsaturated carboxylic acid and an aliphatic polyhydric alcohol compound and an amide between an unsaturated carboxylic acid and an aliphatic polyamine compound are used. Also, an addition reaction product of an ester or amide of unsaturated carboxylic acid having a nucleophilic substituent, for example, a hydroxy group, an amino group or a mercapto group with a monofunctional or polyfunctional isocyanate or epoxy compound, and a dehydration condensation reaction product of the ester or amide with a monofunctional or polyfunctional carboxylic acid can be preferably used. Further, an addition reaction product of an unsaturated carboxylic acid ester or amide having an electrophilic substituent, for example, an isocyanate group or an epoxy group with a monofunctional or polyfunctional alcohol, amine or thiol, and a substitution reaction product of an unsaturated carboxylic acid ester or amide having a releasing substituent, for example, a halogen atom or a tosyloxy group with a monofunctional or polyfunctional alcohol, amiine or thiol are preferred.

As other example, compounds which are obtained by using an unsaturated phosphonic acid, styrene or vinyl ether in place of the above-described unsaturated carboxylic acid can also be used.

Specific examples of the monomer of the ester between an aliphatic polyhydric alcohol compound and an unsaturated carboxylic acid include acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythnitol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer and isocyanuric acid EO modified triacrylate; methacrylates, for example, tetramethylene glycol dimethacrylate, triethylene glycol dimethacrylate, neopentyl glycol dimethacrylate, trimetbylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerytiritol hexamethacrylate, sorbitol trimethacrylate, sorbitol tetramethacrylate, bis[p-(3-methacryloxy-2-hydroxypropoxy)phenyl]dimethylmethane and bis-[p-(methacryloxyethoxy)phenyl]dimethylmethane; itaconates, for example, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonatates, for example, ethylene glycol dicrotonate, tetramethylene glycol dicrotonate, pentaerythritol dicrotonate and sorbitol tetracrotonate; isocrotonates, for example, ethylene glycol diisocrotonate, pentaerythritol diisocrotonate and sorbitol tetraisocrotonate; and maleates, for example, ethylene glycol dimaleate, triethylene glycol dimaleate, pentaerythritol dimaleate and sorbitol tetramaleate As examples of other esters, aliphatic alcohol esters described in JP-B-51-47334 and JP-A-57-196231, esters having an aromatic skeleton described in JP-A-59-5240, JP-A-59-5241 and JP-A-2-226149, and amino group-containing esters described in JP-A-1-165613 may also preferably be used.

The ester monomers described above may be used as a mixture thereof

Also, specific examples of the amide monomer of an aliphatic polyamine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. As other examples of preferred amide type monomer, there are illustrated cyclohexylene structure-containing monomers described in JP-B-54-21726.

Urethane type addition-polymerizable compounds produced by using the addition reaction of an isocyanato group with a hydroxy group are also preferred. Specific examples thereof include vinylurethane compounds having two or more polymerizable vinyl groups per molecule described in JP-B-

48-41708, which are obtained by adding a hydroxy group-containing vinyl monomer represented by formula (III) shown below to a polyisocyanate compound having two or more isocyanato groups per molecule.

$$CH_2=C(R_4)COOCH_2CH(R_5)OH \qquad (III)$$

wherein $R_4$ and $R_5$ each independently represents H or $CH_3$.

Also, urethane acrylates described in JP-A-51-37193, JP-B-2-32293 and JP-B-2-16765 and urethane compounds having an ethylene oxide skeleton described in JP-B-58-49860, JP-B-56-17654, JP-B-62-39417 and JP-B-62-39418 are preferred. Further, the use of addition polymerizable compounds having an amino structure or a sulfide structure in the molecule thereof described in JP-A-63-277653, JP-A-63-260909 and JP-A-1-105238 can provide a photopolymerizable composition having an extremely excellent photosensitive speed.

As other examples, there may be illustrated polyester acrylates described in JP-A-48-64183, JP-B-49-43191 and JP-B-52-30490 and polyfunctional acrylates or methacrylates, for example, epoxyacrylates obtained by reacting an epoxy resin with (meth)acrylic acid. Also, there may be illustrated specific unsaturated compounds described in JP-B-4643946, JP-B-140337 and JP-B-1-40336 and vinylsulfonic acid type compounds described in JP-A-2-25493. Further, in some cases, a perfluoroalkyl group-containing structure described in JP-A-61-22048 may preferably be used. Still further, photo-curable monomers and oligomers described in *Nippon Secchaku Kyokaishi*, Vol 20, No. 7, pages 300 to 308 (1984) may be used.

Details on the use of the addition polymerizable compound, for example, selection of the structure of the compound, selection between independent use and combined use of two or more of the compounds and decision of the addition amount, may be appropriately determined according to the designed performances of the lithographic printing plate precursor. For example, they are determined from the following viewpoints.

In view of sensitivity, a structure having a large amount of unsaturated group per molecule is preferred and, in many cases, the structure having 2 or more functional groups is preferred. Also, in order to enhance strength of the image area, that is, the hardened layer, a structure having three or more functional groups is preferred. It is also effective to use in combination compounds having a different number of the functional group or having a different polymerizable group (for example, an acrylate, a methacrylate, a styrene compound or a vinyl ether compound) to adjust both the sensitivity and the strength.

Also, compatibility with other components (for example, a binder polymer, an initiator or a coloring agent) in the photopolymerizing layer and dispersibility in the layer are important factors in selecting the kind and method for use of the polymerizable compound. For example, use of the compound of a low purity or use of two or more of the compounds in combination can improve compatibility in some cases. Also, a specific structure can be selected for the purpose of improving adhesion to a support or an overcoat layer described hereinafter.

The polymerizable compound is preferably used in an amount of from 5 to 80% by weight, more preferably from 25 to 75% by weight, based on the non-volatile component of the photopolymerizing layer. The polymerizable compounds may be used independently or in combination of two or more thereof. Further, as to the use of the polymerizable compound, the structure, combination and amount thereof may be appropriately determined in view of degree of polymerization inhibition by oxygen, resolution, fogging property, change in refractivity and surface tackiness and further, in some cases, a layer structure, for example, an undercoat or an overcoat and a coating method.

In the invention, several embodiments can be employed in order to incorporate the above-described constituting components of the photopolymerizing layer and other constituting components described hereinafter into the photopolymerizing layer. One embodiment is a photopolymerizing layer of molecular dispersion type prepared by dissolving the constituting components in an appropriate solvent to coat as described, for example, in JP-A-2002-287334. Another embodiment is a photopolymerizing layer of microcapsule type prepared by encapsulating all or part of the constituting components into microcapsules to incorporate into the photopolymerizing layer as described, for example, in JP-A-2001-277740 and JP-A-2001-277742. In the photopolymerizing layer of microcapsule type, the constituting components may be present outside the microcapsules. It is a more preferred embodiment of the photopolymerizing layer of microcapsule type that hydrophobic constituting components is encapsulated in microcapsules and hydrophilic components are present outside the microcapsules. In order to achieve more preferred on-machine development property, the photopolymerizing layer is preferably the photopolymerizing layer of microcapsule type.

As a method of microencapsulating the constituting components of the photopolymerizing layer, known methods can be used. Methods of manufacturing microcapsules include, for example, a method of utilizing coacervation described in U.S. Pat. Nos. 2,800,457 and 2,800,458, a method of using interfacial polymerization described in U.S. Pat. No. 3,287,154, WP-B-38-19574 and JP-B42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferred microcapsule wall used in the invention has three-dimensional crosslinking and has a solvent-swellable property. From this point of view, a preferred wall material of the microcapsule includes polyurea, polyurethane, polyester, polycarbonate, polyamide and a mixture thereof and particularly polyurea and polyurethane are preferred. Further, a compound having a crosslinkable functional group, for example, an ethylenically unsaturated bond, capable of being introduced into the binder polymer described above may be introduced into the microcapsule wall.

An average particle size of the microcapsule is preferably from 0.01 to 3.0 μm, more preferably from 0.05 to 2.0 μm, and particularly preferably from 0.10 to 1.0 μm. In the above-described range, favorable resolution and good preservation stability can be achieved.

[Other Additives]

The photopolymerizing layer according to the invention may contain components other than those described above, for example, a surfactant, a coloring agent, a printing-out agent, a polymerization inhibitor (thermal polymerization preventing agent), a higher fatty acid derivative, a plasticizer, a fine organic particle or a low molecular weight hydrophilic compound. The additives may be added to the photopolymerizing layer in the state of molecular dispersion and, if desired, may be encapsulated into microcapsules together with the above-described polymerizable compound.

<Surfactant>

In the invention, it is preferred to use a surfactant in the photopolymerizing layer in order to promote the on-machine development at the start of printing and to improve the surface property of the layer. The surfactant includes, for example, a nonionic surfactant, an anionic surfactant, a cationic surfactant, an amphoteric surfactant and a fluorine-containing surfactant. The surfactants may be used individually or in combination of two or more thereof.

The nonionic surfactant used in the invention is not particular restricted, and those hitherto known can be used. Examples of the nonionic surfactant include polyoxyethylene alkyl ethers, polyoxyethylene alkylphenylethers, polyoxyethylene polystyrylphenyl ethers, polyoxyethylene polyoxypropylene alkyl ethers, glycerin fatty acid partial esters, sorbitan fatty acid partial esters, pentaerthritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylarnines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and those hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated beef tallow oils, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partially saponified products of styrene/maleic anhydride copolymer, partially saponified products of olefin/maleic anhydride copolymer, and naphthalene sulfonate formalin condensates.

The cationic surfactant used in the invention is not particularly restricted and those hitherto known can be used. Examples of the cationic surfactant include alkylamnine salts, quaternary ammonium salts, polyoxyethylene alkyl amine salts, and polyethylene polyamine derivatives.

The amphoteric surfactant used in the invention is not particularly restricted and those hitherto known can be used. Examples of the amphoteric surfactant include carboxybetaines, aminocarboxylic acids, sulfobetaines, aminosulfuric esters, and imidazolines.

In the surfactants described above, "polyoxyethylene" can be reworded as "polyoxyalkylene", including, for example, polyoxymethylene, polyoxypropylene or polyoxybutylene, and such surfactants can also be used in the invention.

Further, a preferred surfactant includes a fluorine-containing surfactant including a perfluoroalkyl group in its molecule. Examples of the fluorine-containing surfactant include an anionic type, for example, perfluoroalkyl carboxylates, perfluoroalkyl sulfonates and perfluoroalkylphosphates; an amphoteric type, for example, perfluoroalkyl betaines; a cationic type, for example, perfluoroalkyl trimethyl ammonium salts, and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group, and urethanes having a perfluoroalkyl group and an oleophilic group. Moreover, fluorine-containing surfactants described in JP-A-6Z-170950, JP-A-62-226143 and JP-A-60-168144 are also preferable.

A content of the surfactant is preferably from 0.001 to 10% by weight, more preferably from 0.01 to 5% by weight, based on the total solid content of the photopolymerizing layer.

<Coloring Agent>

In the invention, various compounds other than those described above may be added to the photopolymerizing layer, if desired. For example, a dye having a large absorption in a visible region can be used as a coloring agent of an image. Specifically, the dye includes Oil yellow #101, Oil yellow #103, Oil pink #312, Oil green BG, Oil blue BOS, Oil blue #603, Oil black BY, Oil black BS, Oil black T-505 (manufactured by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily made after the formation of image. An amount of the coloring agent added is preferably from 0.01 to 10% by weight based on the total solid content of the photopolymerizing layer.

<Print-out Agent>

To the photopolymerizing layer according to the invention, a compound causing change in color by an acid or a radical can be added in order to form a printout image. As such a compound, various kinds of dyes, for example, dyes of diphenylmethane type, triphenylmethane type, thiazine type, oxazine type, xanthene type, anthraquinone type, imminoquinone type, azo type and azomethine type are effectively used.

Specific examples thereof include dyes, for example, Brilliant green, Ethyl violet, Methyl green, Crystal violet, Basic fuchsine, Methyl violet 2B, Quinaldine red, Rose bengal, Methanyl yellow, Thimol sulfophthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (manufactured by Hodogaya Chemical Co., Ltd.), Oil blue #603 (manufactured by Orient Chemical Industries, Ltd.), Oil pink #312 (manufactured by Orient Chemical Industries, Ltd.), Oil red 5B (manufactured by Orient Chemical Industries, Ltd.), Oil scarlet #308 (manufactured by Orient Chemical Industries, Ltd.), Oil red OG (manufactured by Orient Chemical Industries, Ltd.), Oil red RR (manufactured by Orient Chemical Industries, Ltd.), Oil green #502 (manufactured by Orient Chemical Industries, Ltd.), Spiron red BEH special (manufactured by Hodogaya Chemical Co., Ltd.), m-Cresol purple, Cresol red, Rhodamine B, Rhodamine 6G, Sulfo Rhodamine E, Auramine, 4-p-diethylaminophenyliminonaphthoquione, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl4-p-diethylaminophenylimino-5-pyrazolon and 1-β-naphtyl-4-p-diethylaminophenylimino-5-pyrazolon, and leuco dyes, for example, p, p', p"-hexamethyltriaminotriphenylmethane (leuco Crystal violet) and Pergascript Blue SRB (manufactured by Ciba Geigy Ltd.].

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-N-phenyl-N-methylamino)-6-(N-p-tolyl-N-ethyl)aminofluoran, 2-anilino-3-methyl-6(N-ethyl-p-tolidino)fluoran, 3,6dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N-N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6methoxy-7-aminofluoran, 3-(N,N-diethylanino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)4-diphthalide and 3-(4-diethylaminophenyl)-3-(1-ethyl-2-methylindol-3-yl) phthalide.

A preferred amount of the dye causing change in color by an acid or radical added is from 0.01 to 10% by weight based on the total solid content of the photopolymerizing layer.

<Polymerization Inhibitor>

It is preferred to add a small amount of a thermal polymerization inhibitor to the photopolymerizing layer according to the invention in order to prevent undesirable thermal polymerization of the radical polymerizable compound during the production or preservation of the photopolymerizing layer.

The thermal polymerization inhibitor preferably includes, for example, hydroquinone, p-methoxyphenol, di-tert-butyl-p-cresol, pyrogallol, tert-butylcatechol, benzoquinone, 4,4-thiobis(3-methyl-6-tert-butylphenol), 2,2-methylenebis(4-methyl-6- tert-butylphenol) and N-nitroso-N-phenylhydroxylamine aluminum salt.

An amount of the thermal polymerization inhibitor added is preferably from about 0.01 to about 5% by weight based on the total solid content of the photopolymerizing layer.

<Higher Fatty Acid Derivative>

To the photopolymerizing layer according to the invention, a higher fatty acid derivative or the like, for example, behenic acid or behenic acid amide may be added to localize on the surface of the photopolymerizing layer during a drying step after coating the layer in order to prevent inhibition of polymerization due to oxygen. An amount of the higher fatty acid derivative added is preferably from about 0.1 to about 10 by weight based on the total solid content of the photopolymerizing layer.

<Plasticizer>

The photopolymerizing layer according to the invention may also contain a plasticizer in order to improve the on-machine development property.

The plasticizer preferably includes, for example, a phthalate ester, e.g., diemthylphthalate, diethylphthalate, dibutylphthalate, diisobutylphthalate, dioctylphthalate, octylcaprylphthalate, dicyclohexylphthalate, ditridecylphthalate, butylbenzylphthalate, diisodecylphthalate or diallylphthalate; a glycol ester, e g., dimethylglycolphthalate, ehtylphtarylethylglycolate, methylphthantlethylglycolate, butylphtharylbutylglycolate or triethylene glycol dicaprylate ester; a phosphate ester, e.g., tricresylphosphate or triphenylphosphate; an aliphatic dibasic acid ester, e.g., diisobutyladipate, dioctyladipate, dimethylsebacate, dibutylsebacate, dioctylazelate or dibutylmaleate; polyglycidylmethacrylate, triethyl citrate, glycerin triacetyl ester and butyl laurate.

A content of the plasticizer is preferably about 30% by weight or less based on the total solid content of the photopolymerizing layer.

<Fine Inorganic Particle>

The photopolymerizing layer according to the invention may contain fine inorganic particle in order to improve the hardened film strength of the image area and the on-machine development property of the non-imaging area.

The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the film or enhancing interface adhesion due to surface roughening.

The fine inorganic particle preferably has an average particle-size of-from 5 nm to 10 μm, and more preferably from 0.5 to 3 μm. In the above-described range, it is stably dispersed in the photopolymerizing layer, sufficiently maintains the film strength of the photopolymerizing layer and can fonn the non-imaging area excellent in hydrophilisity and preventing from stain at printing.

The fine inorganic particle described above is easily available as a commercial product, for example, colloidal silica dispersion.

A content of the fine inorganic particle is preferably 40% by weight or less, and more preferably 30% by weight or less, based on the total solid content of the photopolymerizing layer.

<Low Molecular Hydrophilic Compound>

The photopolymerizing layer according to the invention may contain a hydrophilic low molecular compound in order to improve the on-machine development property. The hydrophilic low molecular compound includes water-soluble organic compounds, for example, a glycol compound, e.g., ethylene glycol, diethylene glycol, triethylene glycol, propylene glycol, dipropylene glycol, tripropylene glycol or an ether or ester derivative thereof, a polyhydroxy compound, e.g., glycerine or pentaerythritol, an organic amine or a salt thereof, e,g., tnethanol amine, diethanol amine or monoethanol amine, an organic sulfonic acid or a salt thereof, e.g., toluene sulfonic acid or benzene sulfonic acid, an organic phosphonic acid or a salt thereof, e.g., phenyl phosphonic acid, an organic carboxylic acid or a salt thereof e.g., tartaric acid, oxalic acid, citric acid, maleic acid, lactic acid, gluconic acid or an amino acid.

<Formation of Photopolymerizing Layer>

The photopolymerizing layer according to the invention is formed by dispersing or dissolving each of the necessary components described above in a solvent to prepare a coating solution and coating it. The solvent used includes, for example, ethylene dichloride, cyclohexanone, methyl ethyl ketone, methanol, ethanol, propanol, ethylene glycol monomethyl ether, 1-rnethoxy-2-propanol, 2-methxyethyl acetat, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, y-butyl lactone, toluene and water, but the invention should not be construed as being limited thereto. The solvents may be used individually or as a mixture. The solid concentration of the coating solution is preferably from 1 to 50% by weight.

The photopolymerizing layer according to the invention may also be formed by preparing plural coating solutions by dispersing or dissolving the same or different components described above into the same or different solvents and conducting repeatedly coating and drying several times.

A coating amount of the photopolymerizing layer (solid content) on the support after the coating and drying may be varied depending on the use, but ordinarily, the amount is preferably from 0.3 to 3.0 g/m$^2$. In the above-described range, the favorable sensitivity and good film property of the photopolymerizing layer can be obtained.

Various methods can be used for the coating. Examples of the method include bar coater coating, spin coating, spray coating, curtain coating, dip coating, air knife coating, blade coating and roll coating.

<Support>

The support for use in the lithographic printing plate precursor of the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. A preferred support includes a polyester film and an aluminum plate, Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content, of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0. 1 to 0.6 mm, and more preferably from 0.15 to 0.4 mm.

Prior to the use of aluminum plate, a surface treatment, for example, roughening treatment or anodizing treatment is preferably performed. The surface treatment facilitates improvement in the hydrophilic property and ensures adhesion between the photopolymerizing layer and the support. Prior to the roughening treatment of the aluminum plate, a degreasing treatment, for example, with a surfctant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball grinding, brush grinding, blast grinding or buffgrinding can be used. Also, a transfer method may be employed wherein concavo-convex shape of a roll having concavo-convex shape is transferred to the surface of aluminum plate during a rolling step of aluminum plate.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m. In the above-described range, good printing durability and favorable scratch resistance in the non-image area of lithographic printing plate can be achieved.

<Sealing Treatment>

The aluminum plate subjected to the surface treatment and having the anodized film is used as it is as the support in the invention. However, in order to more improve adhesion to a layer provided thereon, hydrophilisity, resistance to stain, heat insulating property or the like, other treatment, for example, a treatment for enlarging micropores or a sealing treatment of micropores of the anodized film described in JP-A-2001-253181 and JP-A-200]-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, for example, as well as a sealing treatment with steam, a sealing treatment with fluorozirconic acid alone, a sealing treatment with sodium fluoride, a sealing treatment with steam having added thereto lithium chloride may be employed.

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatments are described in more detail below.

<Sealing Treatment with Aqueous Solution Containing Inorganic Fluorine Compound>

As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of satisfactory sealing of micropores of the anodized film, and it is preferably 1% by weight or less, more preferably 0.5% by weight or less in view of stain resistance.

The aqueous solution containing an inorganic fluorine compound preferably further contains a phosphate compound. When the phosphate compound is contained, the hydrophilicity on the anodized film surface is increased and thus, the on-machine development property and stain resistance can be improved.

Preferred examples of the phosphate compound include phosphates of metal, for example, an alkali metal or an alkaline earth metal.

Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phospliotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of the inorganic fluorine compound and the phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-machine development property and stain resistance, and it is preferably 20% by weight or less, more preferably 5% by weight or less, in view of solubility.

The ratio of respective compounds in the aqueous solution is not particularly limited, and the weight ratio between the inorganic fluorine compound and the phosphate compound is preferably from 1/200 to 10/), more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably I or more, more preferably 2 or more, and it is preferably 11 or less, more preferably 5 or less.

A method of the sealing treatment with the aqueous solution containing an inorganic fluorine compound is not particularly limited, and examples thereof include a dipping method and a spray method. One of the treatments may be used alone once or multiple times, or two or more thereof may be used in combination.

In particular, a dipping method is preferred. In the case of performing the treatment using the dipping method, the treating time is preferably one second or more, more preferably 3 seconds or more, and it is preferably 100 seconds or less, more preferably 20 seconds or less.

<Sealing Treatment with Water Vapor>

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably from (atmospheric pressure −50 mmAq) to (atmospheric pressure +300 mmAq) (from $1.008 \times 10^5$ to $1.043 \times 10^5$ Pa).

The time period for which water vapor is contacted is preferably one second or more, more preferably 3 seconds or more, and it is preferably 100 seconds or less, more preferably 20 seconds or less.

<Sealing Treatment with Hot Water>

Examples of the sealing treatment with hot water include a method of dipping the aluminum plate having formed thereon the anodized film in hot water.

The hot water may contain an inorganic salt (for example, phosphate) or an organic salt.

The temperature of the hot water is preferably 80° C. or more, more preferably 95° C. or more, and it is preferably 100° C. or less.

The time period for which the aluminum plate is dipped in hot water is preferably one second or more, more preferably 3 seconds or more, and it is preferably 100 seconds or less, more preferably 20 seconds or less.

<Hydrophilizing Treatment>

The hydrophilizing treatment includes an alkali metal silicate method described in U.S. Pat. Nos. 2,714,066, 3,181, 461, 3,280,734 and 3,902,734. In the method, the support is subjected to immersion treatment or electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,863, 4,153,461, and 4,689,272.

In the case of using a support having a surface of insufficient hydrophilisity, for example, a polyester film, in the invention, it is desirable to coat a hydrophilic layer thereon to make the surface sufficiently hydrophilic. The hydrophilic layer preferably includes a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate and a hydrophilic layer comprising an inorganic thin layer having a surface containing metal oxide. Among them, the hydrophilic layer formed by coating a coating solution containing a colloid of an oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 may be used.

The support preferably has a center line average roughness of from 0.10 to 1.2 µm. In the above-described range, good adhesion to the photopolymerizing layer, good printing durability, and good stain resistance can be achieved.

[Back Coat Layer]

After applying the surface treatment to the support or forming the undercoat layer on the support, a back coat layer can be provided on the back surface of the support, if desired.

The back coat layer preferably includes, for example, a coating layer comprising an organic polymer compound described in JP-A-545885, and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Undercoat Layer]

In the lithographic printing plate precursor of the invention, an undercoat layer is provided between the photopolymerizing layer and the support, if desired. It is advantageous that in the case of infrared laser exposure, since the undercoat layer acts as a heat insulating layer, heat generated upon the exposure does not diffuse into the support and is efficiently utilized so that increase in sensitivity can be achieved. Further, the undercoat layer makes removal of the photopolymerizing layer from the support in the unexposed area easy and the on-machine development property is improved.

As the undercoat layer, specifically, for example, a layer comprising a silane coupling agent having an addition-polymerizable ethylenic double bond reactive group described in JP-A-10-282679 and a layer comprising a phosphorus compound having an ethylenic double bond reactive group are preferably exemplified.

The coating amount (solid content) of the undercoat layer is preferably from 0.1 to 100 mg/m², more preferably from 3 to 30 mg/m².

[Protective Layer]

In the lithographic printing plate precursor according to the invention, a protective layer may be provided on the photopolymerzing layer, if desired, for the purpose of preventing the occurrence of scratch or the like, blocking oxygen and preventing ablation at the exposure with a laser having high illumination in the photopolymerizing layer.

In the invention, the exposure is ordinarily conducted in the atmosphere, and the protective layer prevents invasion of a low molecular compound that hinders a image-forming reaction initiated by the image exposure in the photopolymerizing layer, for example, oxygen or a basic substance present in the atmosphere thereby preventing the hindrance of the image-forming reaction by the exposure in the atmosphere. Accordingly, characteristics desired to the protective layer preferably include that it has good transmission of light used for exposure, that it is excellent in adhesion to the photopolymerizing layer and that it can be easily removed by the on-machine developing step after the exposure as well as it has low permeability of the low molecular compound, for example, oxygen. The protective layers having such characteristics have been heretofore variously studied and described in detail, for example, in U.S. Pat. No. 3,458,311 and JP-A-55-49729.

The material used for the protective layer includes, for example, a water-soluble polymer compound of relatively excellent crystallinity. Specifically, it includes a water-soluble polymer, for example, polyvinyl alcohol, polyvinyl pyrrolidone, an acidic cellulose, gelatin, gum Arabic and polyacrylic acid. Among them, the use of polyvinyl alcohol (PVA) as the main component provides the most preferred result for the basic characteristics, for example, oxygen blocking property and removability upon development. The polyvinyl alcohol may be partially substituted with ester, ether or acetal or partially have other copolymerization component as long as it contains unsubstituted vinyl alcohol units for providing the protective layer with the necessary oxygen blocking property and water solubility.

Preferred examples of the polyvinyl alcohol include those having a hydrolysis rate of from 71 to 100% by mole and a polymerization degree ranging from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217FA PVA-217E, PVA-220E, PVA-224E, PVA-405, PVA-420, PVA-613 and L-8 manufactured by Kuraray Co., Ltd.

The component (for example, selection of PVA, use of additive) and the coating amount of the protective layer are appropriately selected in consideration of fog-preventing property, adhesion and scratch resistance as well as the oxygen blocking property and removability upon development. Ordinarily, as the hydrolysis rate of PVA is higher (that is, the content of unsubstituted vinyl alcohol unit present in the protective layer is higher) or as the thickness of the protective layer is larger, the oxygen blocking property is enhanced and it is preferred in view of the sensitivity. Further, for preventing occurrence of undesirable polymerization reaction during the manufacture and preservation and preventing undesirable fog and thickening of image line at the image exposure, it is preferred that the oxygen permeability is not excessively high. Accordingly, the oxygen permeability A at 25° C. under 1 atom is preferably as follows:

$0.2 \leq A \leq 20$ (cc/m$^2$·day).

As other composition for the protective layer, glycerin, dipropylene glycol, etc can be added in an amount corresponding to several % by weight to the polymer compound in order to impart flexibility. Further, an anionic surfactant, for example, sodium alkyl sulfate or sodium alkyl sulfonate; an amphoteric surfactant, for example, alkylamino carboxylic acid salt or alkylamino dicarboxylic acid salt; or a non-ionic surfactant, for example, polyoxyethylene alkylphenyl ether can be added by several % by weight to the polymer compound.

The thickness of the protective film is suitably from 0.05 to 4 μm, and particularly preferably from 0.1 to 2.5 μm.

Further, the adhesion to the image area, scratch resistance, etc. of the protective layer are also extremely important in view of handling of the lithographic printing plate precursor. Specifically, when a protective layer, which is hydrophilic due to the incorporation of the water-soluble polymer compound, is coated on the oleophilic photopolymerizing layer, peeling of the protective layer is apt to occur because of the insufficiency of adhesion and it may sometimes result in defect, for example, poor film hardening caused by polymerization inhibition due to oxygen.

Various proposals have been made for the purpose of improving the adhesion between the photopolymerizing layer and the protective layer. For example, it is described in JP-A49-70702 and British Patent 1,303,578 that sufficient adhesion can be obtained by mixing from 20 to 60% by weight of an acrylic emulsion, a water-insoluble vinyl pyrrolidone—vinyl acetate copolymer or the like in a hydrophilic polymer mainly comprising polyvinyl alcohol and coating the mixture on the photopolymerizing layer. In the invention, any of the known techniques can be used. The coating method of the protective layer is described in detail, for example, in U.S. Pat. No. 3,458,311 and JP-A-55-49729.

Further, other functions can also be provided to the protective layer. For example, by adding a coloring agent (for example, a water-soluble dye), which is excellent in transmission of infrared ray used for the exposure and capable of efficiently absorbing light at other wavelength, a safe light adaptability can be improved without decreasing the sensitivity.

[Exposure]

As a light source for exposure of the lithographic printing plate precursor of the invention, known light sources can be used without limitation. A preferred wavelength of the light source is from 300 to 1,200 nm. Specifically, various kinds of lasers preferably used as the light source, and among them, a semiconductor laser emitting an infrared ray having a wavelength of from 760 to 1,200 nm is preferably used.

The exposure mechanism used may be any of inner drum type, outer drum type and flat bed type can be used.

Further, other exposure light sources used for the lithographic printing plate precursor of the invention include, for example, a super-high pressure, high pressure medium pressure or low pressure mercury lamp, a chemical lamp, a carbon arc lamp, a xenon lamp, a metal halide lamp, a variety of visible or ultraviolet laser lamps, a fluorescent lamp, a tungsten lamp and sunlight.

[Printing]

A lithographic printing method using the lithographic printing plate precursor of the invention is not particularly limited For instance, a method is exemplified wherein the lithographic printing plate precursor of the invention is exposed imagewise by a laser, for example, an infrared laser and then without undergoing the development processing step, oily ink and an aqueous component are supplied to conduct printing.

More specifically, there are illustrated a method wherein the lithographic printing plate precursor is exposed by a laser and without undergoing the development processing step, mounted on a printing machine to perform printing and a method wherein the lithographic printing plate precursor is mounted on a printing machine, exposed by a laser on the printing machine to perform printing without undergoing the development processing step.

After imagewise exposure of the lithographic printing plate precursor by a laser, when an aqueous component and oily ink are supplied to perform printing without undergoing the development processing step, for example, a wet development processing step, the photopolymerizing layer hardened by the exposure forms the oily ink receptive area having an oleophilic surface in the exposed area of the photopolymerizing layer. On the other hand, in the unexposed area, the unhardened photopolymerizing layer is removed by dissolution or dispersion with the aqueous component and/or oily ink supplied to reveal a hydrophilic surface in the area. As a result, the aqueous component is adhered on the revealed hydrophilic surface, the oily ink is adhered to the exposed area of the photopolymerizing layer, and thus printing is initiated. While either the aqueous component or the oily ink may be supplied at first to the plate surface, it is preferred to supply the oily ink at first in view of preventing the aqueous component from contamination with the photopolymerizing layer in the unexposed area. For the aqueous component and oily ink, dampening water and printing ink for conventional lithographic printing are used respectively.

Thus, the lithographic printing plate precursor is subjected to the on-machine development on an offset printing machine and used as it is for printing plurality of sheets.

The lithographic printing plate precursor of the invention may be subjected to development processing using as a developing solution, a non-alkali aqueous solution having pH of 10 or lower after the imagewise exposure. The non-alkali aqueous solution used preferably includes, for example, water alone or an aqueous solution containing water as a main component (containing 60% by weight or more of water). Particularly, an aqueous solution having the same composition as conventionally known dampening water and an aqueous solution containing a surfactant (for example, an anionic, nonionic or cationic surfactant) are preferred. The pH of the developing solution is preferably from 2 to 10, more preferably from 3 to 9, and still more preferably from 5 to 9.

The non-alkali aqueous solution used as the development solution may contain, for example, an organic acid, an inorganic acid and an inorganic salt.

Examples of the organic acid include citric acid, acetic acid, oxalic acid, malonic acid, salicytic acid, caprylic acid, tartaric acid, malic acid, lactic acid, levulinic acid, p-toluenesulfonic acid, xylenesulfonic acid, phytic acid and an organic phosphonic acid. The organic acid can also be used in the form of an alkali metal salt or an ammonium salt. A content of the organic acid is preferably from 0.01 to 5% by weight in the developing solution.

Examples of the inorganic acid and inorganic salt include phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate. A content of the inorganic acid or inorganic salt is preferably from 0.01 to 5% by weight in the developing solution.

The anionic surfactant for use in the developing solution used in the invention includes, for example, fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene/maleic anhydride copolymer, partially saponified products of olefin/maleic anhydride copolymer and naphthalene sulfonate formalin condensates. Of the compounds, dialkylsulfosuccinic ester salts, alkyl sulfate ester salts and alkylnaphthalenesulfonic acid salts are particularly preferably used.

The cationic surfactant for use in the developing solution used in the invention is not particularly limited and conventionally known cationic surfactants can be used, Examples of the cationic surfactant include alkylamine salts, quaternary ammonium salts, polyoxyethylene alkyl amine salts and polyethylene polyamine derivatives.

The nonionic surfactant for use in the developing solution used in the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamnine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

The surfactants may be used individually or as a mixture of two or more thereof In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferred.

Further, from the standpoint of stable solubility in water or opacity, with respect to the nonionic surfactant used in the developing solution according to the invention, the HLB (hydrophile-lipophile balance) value thereof is preferably 6 or more, and more preferably 8 or more.

Moreover, an amount of the surfactant contained in the developing solution is preferably from 0.01 to 10% by weight, and more preferably from 0.01 to 5% by weight. Furthermore, oxyethylene adducts of acetylene glycol type or acetylene alcohol type and surfactants, for example, fluorine-containing surfactants or silicon-containing surfactants are also be used.

Of the surfactants used in the developing solution according to the invention, the nonionic surfactant is particularly preferred in view of foam preventing property.

The developing solution used in the invention may contain an organic solvent. The organic solvent that can be included in the developing solution include, for example, aliphatic hydrocarbons (e.g., hexane, heptane, Isopar E, Isopar H, Isopar G (produced by Esso Chemical Co., Ltd.), gasoline or kerosene), aromatic hydrocarbons (e.g., toluene or xylene), halogenated hydrocarbons (methylene dichloride, ethylene dichloride, trichlene or nomochlorobenzene) and polar solvents shown below.

Examples of the polar solvent include alcohols (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methyamyl alcohol), ketones (e.g., acetone, methyl ethyl ketone, ethyl butyl ketone, methyl isobutyl ketone or cyclohexanone), esters (e.g., ethyl acetate, propyl acetate, butyl acetate, aryl acetate, benzyl acetate, methyl lactate, butyl lactate, ethylene glycol monobutyl acetate, polyethylene glycol monomethyl ether acetate, diethylene glycol acetate, diethyl phthalate, butyl levulinate) and others (e.g., triethyl phosphate, tricresyl phosphate, N-phenyl ethanol amine or N-phenyldiethanolamine).

Further, when the organic solvent is insoluble in water, it may be used by being solubilized in water using a surfactant or the like. In the case where the developing solution contains the organic solvent, the concentration of the organic solvent is desirably less than 40% by weight in view of safety and inflammability.

Moreover, the developing solution used in the invention may contain a water-soluble polymer compound, for example, soybean polysaccharide, modified starch, gum Arabic, dextrin, cellulose derivatives (for example, carboxymethyl cellulose, carboxyethyl cellulose or methyl cellulose) and modified products thereof, pllulan, polyvinyl alcohol and derivatives thereof, polyvinyl pyrrolidone, polyacrylamide, acrylamide copolymer, vinyl methyl ether/maleic anhydride copolymer, vinyl acetate/maleic anhydride copolymer and styrenelmaleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity of from 10 to 100 mPa/sec in a 10% by weight aqueous solution thereof As the modified starch, those known can be used. The modified starch can be prepared, for example, by a method wherein starch of, for example, corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, and more preferably from 0.5 to 10% by weight in the developing solution.

Into the developing solution used in the invention, an antiseptic agent, a chelating agent, a defoaming agent or the like may be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof sodium salt thereof; hydroxyethylethylenediaminetriacetic acid, potassium salt thereof, sodium salt thereof; nitrilotriacetic acid, sodium salt thereof; organic phosphonic acids, for example, 1-bydroxyethane-1,1-diphosphonic acid, potassium salt thereof, sodium salt thereof; aminotri(methylenephosphonic acid), potassium salt thereof, sodium salt thereof; and phophonoalkanetricarboxylic acids are illustrated. A salt of an organic amine is also useful in place of the sodium salt or potassium salt in the chelating agents.

As the defoaming agent, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

The development processing using the non-alkali aqueous solution in the invention is preferably performed by an automatic developing machine equipped with supplying means for a developing solution and a scraping member. As the automatic developing machine, there are illustrated an automatic developing machine in which a lithographic printing plate precursor after image-recording is subjected to scraping treatment while it is transporting as described in JP-A-2-220061 and JP-A-60-59351, and an automatic developing machine in which a lithographic printing plate precursor after image-recording placed on a cylinder is subjected to scraping treatment while rotating the cylinder as described in U.S. Pat. Nos. 5,148,746 and 5,568,768 and British Patent 2,297,719. Among them, an automatic developing machine using a rotating brush roll as the scraping member is particularly preferred. The lithographic printing plate precursor after the scraping treatment may be successively subjected to washing with water, drying treatment, oil-desensitizing treatment, if desired.

The temperature of the developing solution can be appropriately determined and it is preferably from 10 to 50° C., The invention will be described in more detail with reference to the following examples, but the invention should not be construed as being limited thereto.

1. Preparation of Lithographic Printing Plate Precursor (1) Preparation of Support <Support A>

An aluminum plate (material: JIS 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm), followed by thorough washing with water. The plate was etched by immersing in a 25% by weight aqueous sodium hydroxide solution of 45° C. for 9 seconds, washed with water, then immersed in a 20% by weight nitric acid at 60° C. for 20 seconds, and washed with water. The etching amount of the grained surface was about 3 g/cm$^2$.

Then, using an alternating current of 60 Hz, an electrochemical roughening treatment was continuously carried out on the plate. The electrolyte used was a 1% by weight aqueous nitric acid solution (containing 0.5% by weight of aluminum ion) and the electrolyte temperature was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was shunted to the auxiliary anode, The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolyte, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying. The plate was subjected to an anodizing treatment using as an electrolyte, a 15% by weight sulfuric acid (containing 0.5% by weight of aluminum ion) at a current density of 15 A/dm$^2$ to form a direct current anodized film of 2.5 g/m$^2$, washed with water and dried to obtain Support A. The center line average roughness (Ra) of the support was measured using a stylus having a diameter of 2 μm and it was found to be 0.51 μm.

<Support B>: FZP Treated Substrate

A support having the anodized film prepared in the same manner as in Support A was immersed in an aqueous solution containing 0.1% by weight of sodium fluorozirconate and 1% by weight of sodium dihydrogen phosphate and having pH of 3.7 heated at 75° C. for 10 seconds to perform a sealing treatment. The support was then washed with water and dried to obtain Support B.

<Support C>: FZP Pore Widening Treatment

A support having the anodized film prepared in the same manner as in Support A was treated with a 1% by weight aqueous sodium hydroxide solution at 60° C. for 10 seconds to perform a pore widening treatment of the anodized film. As a result of the treatment, the pore diameter of the anodized film was enlarged to 20 nm.

After the pore widening treatment, the support was immersed in an aqueous solution containing 0.1% by weight of sodium fluorozirconate and 1% by weight of sodium dihydrogen phosphate and having pH of 3.7 heated at 75° C. for 10 seconds to perform a sealing treatment. The support was then washed with water and dried to obtain Support C.

<Support D>: Sealing Treatment with Water Vapor

A support having the anodized film prepared in the same manner as in Support A was exposed to saturated water vapor for 10 seconds to conduct sealing treatment. The support was then washed with water and dried to obtain Support D.

Supports B, C and D were treated with a 2.5% by weight aqueous sodium silicate solution at 30° C. for 10 seconds. The center line average roughness (Ra) of each of the supports was measured using a stylus having a diameter of 2 μm and it was found to be 0.51 μm.

(2) Formation of Undercoat Layer

Undercoat solution (1) shown below was coated Support A and Supports B to D subjected to the silicate treatment so as to have a dry coating amount of 10 mg/m$^2$ to prepare Support AF, BF, CF and DF, respectively, for using the experiments described below.

| Undercoat solution (1) | |
|---|---|
| Undercoat compound (1) shown below | 0.017 g |
| Methanol | 9.00 g |
| Water | 100 g |

Undercoat compound (1)

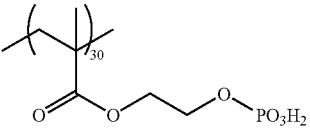

(3) Formation of Photopolymerizing Layer

EXAMPLE 1

On Support BF described above was coated Coating solution (1) for photopolymerizing layer having the composition shown below by a bar and dried in an oven at 100° C. for 60 seconds to form an photopolymerizing layer having a dry coating amount of 1.0 g/m² thereby preparing a lithographic printing plate precursor.

Coating solution (1) for photopolymerizing layer was prepared by mixing and stirring Photosensitive solution (1) and Microcapsule solution (1) shown below, respectively, just before the coating.

| Photosensitive solution (1) | |
|---|---|
| Specific Polymer Compound (Compound (2) illustrated hereinbefore) | 0.162 g |
| Polymerization Initiator (1) shown below | 0.100 g |
| Infrared Absorbing Agent (1) shown below | 0.020 g |
| Polymerizable Monomer (Aronics M-215; produced by Toa Gosei Co., Ltd.) | 0.385 g |
| Fluorine-Containing Surfactant (1) shown below | 0.044 g |
| MEK | 1.091 g |
| MFG | 8.609 g |
| Microcapsule Solution (1) | |
| Microcapsule (1) prepared shown below | 2.640 g |
| Water | 2.425 g |

Polymerization Initiator (1)

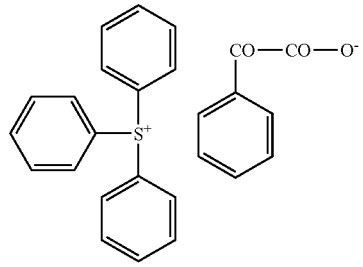

Infrared Absorbing Agent (1)

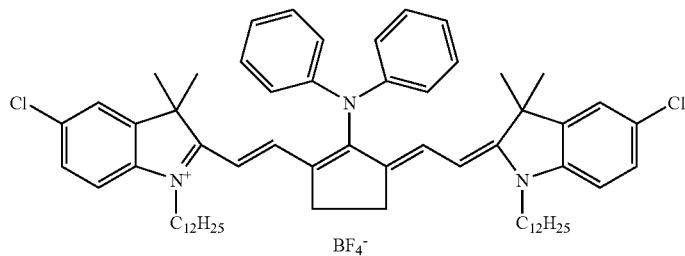

-continued

Fluorine-Containing Surfactant (i)

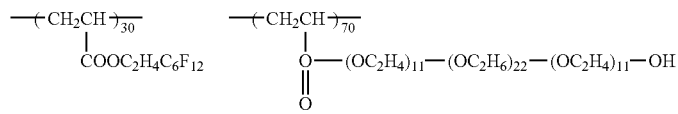

Synthesis Example 1

Synthesis of Specific Polymer Compound (Compound (2)) Described in Example 1

In a 1,000 ml three-necked flask equipped with a condenser and a stirrer was charged 250 g of 1-methoxy-2-propanol followed by heating at 75° C. To the solution was added dropwise a solution prepared by dissolving 124 g of methyl methacrylate, 90 g of Blenmer PN200 (trade name produced by NOF Corp.) and 1.79 g of V-601 (trade name: produced by Wako Pure Chemical Industries, Ltd.) in 250 g of 1-methoxy-2-propanol under nitrogen atmosphere over a period of 2.5 hours.

The solution was subjected to reaction at 75° C. for 2 hours and then poured into water to deposit a copolymer. The copolymer was collected by filtration, washed and dried to obtain Compound (2). As a result of measurement of a weight average molecular weight by gel permeation chromatography (GPC) using polystyrene as a standard substance, it was found to be 120,000. As a result of measurement of Tg by a differential scanning calorimeter (DSC), it was found to be 35° C.

Syntheses of polymer compounds used in Examples 2 to 20 described below were carried out in the same manner as in Synthesis Example 1 above. The weight average molecular weight and Tg of the polymer compounds are shown in Tables 1, 2 and 4.

Preparation of Microcapsule (1)

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.), 0.35 g of Infrared absorbing agent (2) shown below, 1 g of 3-(N,N-diethylamino)-6-methyl-7-anilinofluoran (ODB, produced by Yamamoto Kasei Co., Ltd.) and 0.1 g of Pionine A-41C (produced by Takemoto Oil and Fat Co., Ltd.) in 17 g of ethyl acetate, As an aqueous phase component, 40 g of a 4% by weight aqueous solution of PVA-205 was prepared. The oil phase component and the aqueous phase component were mixed and emulsified using a homogenizer at 12,000 rpm, for 10 minutes. The resulting emulsion was added to 25 g of distilled water and stirred at a room temperature for 30 minutes and then at 40° C. for 3 hours. The thus obtained microcapsule liquid was diluted using distilled water so as to have the solid concentration of 15% by weight. The average particle size of the microcapsule was 0.2 μm.

Comparative Example 1

A lithographic printing plate precursor was prepared in the same manner as in Example 1 except for changing the specific polymer compound to polystyrene (weight average molecular weight: 100,000, Tg: 100° C.) in the formation of photopolymerizing layer.

EXAMPLES 2 to 7

Lithographic printing plate precursors were prepared in the same manner as in Example 1 except for changing the support and the specific polymer compound used in the formation of photopolymerizing layer to those shown in Table 1 below.

TABLE 1

|  | Support | Specific Polymer Compound | Weight Average Molecular Weight | Tg (° C.) |
|---|---|---|---|---|
| Example 2 | AF | Compound (1) | 100,000 | 60 |
| Example 3 | AF | Compound (2) | 120,000 | 35 |
| Example 4 | AF | Compound (4) | 120,000 | 35 |
| Example 5 | BF | Compound (7) | 150,000 | 20 |
| Example 6 | BF | Compound (9) | 110,000 | 30 |
| Example 7 | BF | Compound (19) | 90,000 | 60 |

EXAMPLE 8

On Support AF described above was coated Coating solution (2) for photopolymerizing layer having the composition shown below by a bar and dried in an oven at 100° C. for 60 seconds to form an photopolymerizing layer having a dry coating amount of 1.0 g/m² thereby preparing a lithographic printing plate precursor.

| Coating solution (2) for photopolymerizing layer | |
|---|---|
| Infrared Absorbing Agent (2) shown below | 0.05 g |
| Polymerization Initiator (1) shown above | 0.20 g |
| Specific Polymer Compound (Compound (6) illustrated hereinbefore) | 0.50 g |
| Polymerizable Monomer (Aronics M-215, produced by Toa Gosei Co., Ltd.) | 100 g |
| Naphthalenesulfonate Salt of Victoria Pure Blue | 0.02 g |
| Fluorine-Containing Surfactant (1) shown above. | 10 g |

| -continued |  |
|---|---|
| Coating solution (2) for photopolymerizing layer | |
| Methyl Ethyl Ketone | 18.0 g |
| Infrared Absorbing Agent (2) | |

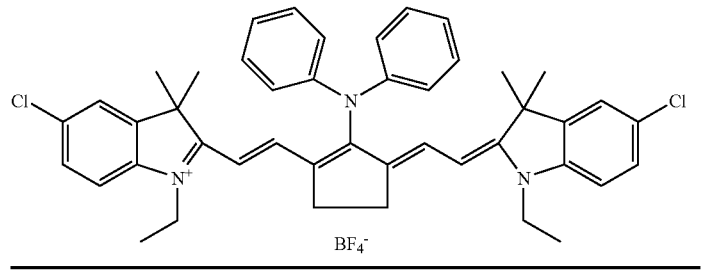

EXAMPLES 9 to 14

Lithographic printing plate precursors were prepared in the same manner as in Example 8 except for changing the support and the specific polymer compound used in the formation of photopolymerzing layer to those shown in Table 2 below.

TABLE 2

|  | Support | Specific Polymer Compound | Weight Average Molecular Weight | Tg (° C.) |
|---|---|---|---|---|
| Example 8 | AF | Compound (6) | 120,000 | 40 |
| Example 9 | AF | Compound (2) | 120,000 | 35 |
| Example 10 | AF | Compound (3) | 110,000 | 35 |
| Example 11 | BF | Compound (5) | 100,000 | 35 |
| Example 12 | BF | Compound (6) | 120,000 | 40 |
| Example 13 | BF | Compound (8) | 140,000 | 0 |
| Example 14 | CF | Compound (20) | 150,000 | 10 |

Comparative Example 2

A lithographic printing plate precursor was prepared in the same manner as in Example 9 except for changing the specific polymer compound to a polymer having a structure shown below (weight average molecular weight: 200,000, Tg: 90° C.) in the formation of photopolymerizing layer.

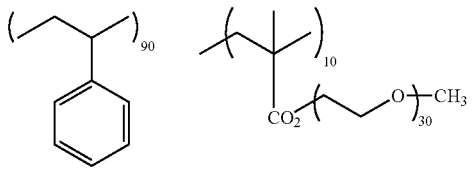

2. Exposure and Printing

Each of the lithographic printing plate precursors obtained in the examples and comparative examples described above was exposed by Trendsetter 3244VX, produced by Creo Co., equipped with a water-cooled 40 W infrared semiconductor laser under the conditions of a power of 9W, a rotational number of an outer surface drum of 210 rpm and a resolution of 2,400 dpi. The exposed image contained a fine line chart. The exposed lithographic printing plate precursor was mounted without conducting development processing on a plate cylinder of a printing machine (SOR-M, produced by Hyderberg Co.). After supplying dampening water EU-3 (etching solution, produced by Fuji Photo Film Co., Ltd.)/water/isopropyl alcohol=1/89/10 (volume ratio)) and ink (TRANS-G (N) black ink (produced by Dainippon Ink and Chemicals, Inc.), 100 sheets of printing was conducted at a printing speed of 6,000 sheets per hour.

A number of printing papers required until on-machine development of the unexposed area of the photopolymerizing layer on the printing machine was completed to reach a state where the ink was not transferred to the printing paper in the non-image area was measured as on-machine development property. As a result, in the case of using any of the lithographic printing plate precursors, printed materials without stain in the non-image area were obtained within the printing of 100 sheets.

3. Evaluation

Ordinarily, in a negative-working lithographic printing plate precursor, when an exposure amount is small, a hardening degree of the photopolymerizing layer (photosensitive layer) becomes low, while when the exposure amount is large, the hardening degree of the photopolymerizing layer becomes high. In the case where the hardening degree of the photopolymerizing layer is too low, printing durability of the lithographic printing plate obtained decreases and reproducibility of small points and fine lines is deteriorated. On the contrary, when the hardening degree of the photopolymerizing layer is high, the printing durability increases and the reproducibility of small points and fine lines is improved.

In the examples, the negative-working lithographic printing plate precursors obtained above were evaluated with the printing durability and reproducibility of fine line under the same exposure conditions as described above and they are used as indexes of sensitivity of the lithographic printing plate precursor. Specifically, it can be said that as a number of printing sheet is large in the printing durability or as a width of fine line in the reproducibility of fine line is small, the sensitivity of the lithographic printing plate precursor is high.

(1) Reproducibility of Fine Line

After the confirmation that printing materials without ink stain in the nonimage area were obtained by the printing of 100 sheets as described above, 500 sheets were successively printed. The fine line chart (a chart including fine lines having 10, 12, 14, 16, 18, 20, 25, 30, 35, 40, 60, 80, 100 and 200 μm in width) on the 600$^{th}$ printed material was observed by a 25-power magnifier and the reproducibility of fine line was evaluated from the width of fine line reproduced by ink without interruption.

(2) Printing Durability

After the printing for the evaluation of reproducibility of fine line as described above, the printing was further continued. As increase in a number of printing sheets, the photopolymerizing layer was gradually abraded to cause decrease in the ink receptivity, resulting in decrease of ink density on printing paper. A number of printed materials obtained until the ink density (reflection density) decreased by 0.1 from that at the initiation of printing was determined to evaluate the printing durability.

The results of the evaluations are shown in Table 3 together with the result of the on-machine development property.

TABLE 3

| | On-Machine Development Property (number of sheets) | Reproducibility of Fine Line (μm) | Printing Durability (number of sheets) |
|---|---|---|---|
| Example 1 | 20 | 16 | 20,000 |
| Example 2 | 40 | 16 | 20,000 |
| Example 3 | 30 | 18 | 20,000 |
| Example 4 | 20 | 25 | 14,000 |
| Example 5 | 25 | 25 | 12,000 |
| Example 6 | 20 | 25 | 12,000 |
| Example 7 | 25 | 16 | 20,000 |
| Example 8 | 25 | 25 | 12,000 |
| Example 9 | 25 | 25 | 15,000 |
| Example 10 | 30 | 30 | 14,000 |
| Example 11 | 25 | 25 | 15,000 |
| Example 12 | 25 | 25 | 12,000 |
| Example 13 | 35 | 25 | 12,000 |
| Example 14 | 30 | 20 | 18,000 |
| Comparative Example 1 | 60 | 30 | 12,000 |
| Comparative Example 2 | 40 | 20 | 5,000 |

EXAMPLES 15 to 17

Lithographic printing plate precursors were prepared in the same manner as in Example 1 except for changing the support and the specific polymer compound used in the formation of photopolymerizing layer to those shown in Table 4 below.

TABLE 4

| | Support | Specific Polymer Compound | Weight Average Molecular Weight | Tg (° C.) |
|---|---|---|---|---|
| Example 15 | AF | Compound (2) | 120,000 | 35 |
| Example 16 | AF | Compound (3) | 110,000 | 35 |
| Example 17 | BF | Compound (15) | 130,000 | 40 |
| Example 18 | AF | Compound (2) | 120,000 | 35 |
| Example 19 | AF | Compound (7) | 150,000 | 20 |
| Example 20 | BF | Compound (12) | 140,000 | 30 |

On the support described in Table 4 above was coated Coating solution (3) for photopolymerizing layer having the composition shown below by a bar and dried in ail oven at 100° C. for 60 seconds to form an photopolymerizing layer having a dry coating amount of 1.0 g/m², and on the photopolymerizing layer was coated Coating solution (1) for protective layer having the composition shown below by a bar and dried at 120° C. for one minute to form a protective layer having a dry coating amount of 0.5 g/m², thereby preparing a lithographic printing plate precursor.

Coating solution (3) for photopolymerizing layer

| | |
|---|---|
| Polymerization Initiator (2) shown below | 0.2 g |
| Sensitizing Dye (1) shown below | 0.5 g |
| Specific Polymer Compound shown in Table 4 | 6.0 g |
| Polymerizable Monomer: Isocyanuric acid EO modified triacrylate (M-315, produced by Toa Gosei Co., Ltd.) | 12.4 g |
| Leuco Crystal Violet | 3.0 g |
| Thermal Polymerization Inhibitor: N-nitrosophenylhydroxylaniine aluminum salt | 0.1 g |
| Tetraethylammonium chloride | 0.1 g |
| Fluorine-Containing Surfactant (I) shown above | 0.1 g |
| Methyl Ethyl Ketone | 70.0 g |
| Polymerization Initiator (2) | |

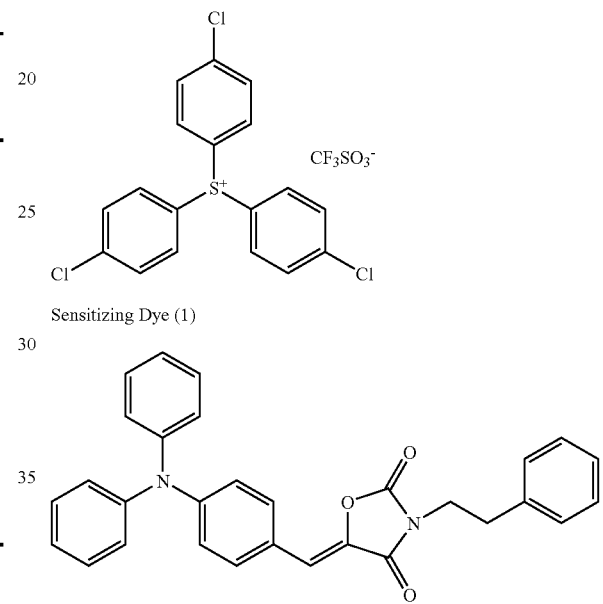

Sensitizing Dye (1)

Coating solution (1) for protective layer

| | |
|---|---|
| Polyvinyl Alcohol (saponification degree: 95 mol %, polymerization degree: 800) | 40 g |
| Polyvinyl Pyrrolidone (molecular weight: 50,000) | 5 g |
| Poly(vinyl pyrroiidone/vinyl acetate (1/1)) (molecular weight: 70,000) | 5 g |
| Water | 950 g |

Comparative Example 3

A lithographic printing plate precursor was prepared in the same manner as in Example 15 except for changing the specific polymer compound to poly(tert-butyl methacrylate) (weight average molecular weight: 120,000, Tg: 120° C.) in the formation of photopolymerizing layer.

EXAMPLES 18 to 20

Lithographic printing plate precursors were prepared in the same manner as in the preparation of Lithographic printing plate precursors 15 to 17 except for changing Coating solution (3) for photopolymerizing layer to Coating solution (4) for photopolymerizing layer having the composition shown below, respectively.

| Coating solution (4) for photopolymerizing layer | |
| --- | --- |
| Polymerization Initiator (3) shown below | 0.2 g |
| Specific Polymer Compound shown in Table 4 | 3.0 g |
| Polymerizable Monomer: Isocyanuric acid EO modified triacrylate (M-315, produced by Toa Gosei Co., Ltd.) | 6.2 g |
| Leuco Crystal Violet | 3.0 g |
| Thermal Polymerization Inhibitor: N-nitrosophenylhydroxylamine aluminum salt | 0.1 g |
| Fluorine-Containing Surfactant (1) shown above | 0.1 g |
| Microcapsule (1) shown above (in terms of solid content) | 10.0 g |
| Methyl Ethyl Ketone | 35.5 g |
| 1-Methoxy-2-propanol | 35.5 g |
| Water | 10.0 g |

Polymerization Initiator (3)

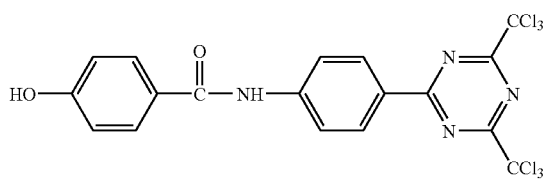

Comparative Example 4

A lithographic printing plate precursor was prepared in the same manner as in Example 18 except for changing the specific polymer compound to tert-butyl methacrylate (weight average molecular weight: 120,000, Tg: 120° C.) in the formation of photopolymerizing layer.

Exposure Method

The lithographic printing plate precursor was exposed by a semiconductor laser of 375 nm or 405 nm under the conditions of a power of 2 mW, a circumferential length of an outer surface drum of 900 mm, a rotational number of the outer surface drum of 800 rpm and a resolution of 2,400 dpi. The drawing time per pixel is shown in Table 5.

Printing Method

The exposed lithographic printing plate precursor was mounted without conducting development processing on a plate cylinder of a printing machine (SOR-M, produced by Hyderberg Co.). After supplying dampening water (EU-3 (etching solution, produced by Puji Photo Film Co., Ltd.)/water/isopropyl alcohol=1/89110 (volume ratio)) and ink (TRANS-G (N) black ink (produced by Dainippon Ink and Chemicals, Inc.), 100 sheets of printing was conducted at a printing speed of 6,000 sheets per hour. As a result, removal of the unexposed area of the photopolymerizing layer was completed on the printing machine and printed materials without stain in the non-image area were obtained Evaluation of Lithographic Printing Plate Precursor The reproducibility of fine line, on-machine development property and printing durability were evaluated in the same manner as in Examples 1 to 14.

<Sensitivity>

After the confirmation that printing materials without ink stain in the non-image area were obtained by the printing of 100 sheets as described above, 500 sheets were successively printed. On the $600^{th}$ printed material, unevenness of ink density in the image area was observed and an exposure amount necessary for providing the unevenness of ink density in the image area was determined to evaluate the sensitivity.

<White Lamp Safety>

An unexposed lithographic printing plate precursor was placed under a white fluorescent lamp to expose under the conditions that the light intensity on the surface of the lithographic printing plate precursor became 400 lux. The lithographic printing plate precursor exposed under the white lamp was mounted without conducting development processing on a plate cylinder of a printing machine (SOR-M, produced by Hyderberg Co.) and printing of 100 sheets was conducted in the same manner as above. Then, an exposure time under the white fluorescent lamp that did not cause ink stain was determined. The longer the time, the better the white lamp safety.

The results obtained are shown in Table 5.

TABLE 5

| | Light Source | Drawing Time per Pixel | Sensitivity (mJ/cm$^2$) | Reproducibility of Fine Line (μm) | On-Machine Development Property (number of sheet) | Printing Durability (number of sheet) | White Lamp Safety (min) |
| --- | --- | --- | --- | --- | --- | --- | --- |
| Example 15 | Semiconductor Laser of 405 nm | 0.9 μsec | 0.18 | 12 | 30 | 20,000 | 240 |
| Example 16 | Laser of 405 nm | 0.9 μsec | 0.2 | 12 | 30 | 20,000 | 240 |
| Example 17 | | 0.9 μsec | 0.2 | 12 | 30 | 20,000 | 240 |
| Example 18 | Semiconductor | 0.9 μsec | 0.05 | 10 | 20 | 20,000 | 240 |
| Example 19 | Laser of 375 nm | 0.9 μsec | 0.07 | 10 | 30 | 18,000 | 180 |
| Example 20 | | 100 μsec | 0.07 | 10 | 25 | 15,000 | 180 |
| Comparative Example 3 | Semiconductor Laser of 405 nm | 0.9 μsec | 0.2 | 12 | 80 | 14,000 | 240 |
| Comparative Example 4 | Semiconductor Laser of 375 nm | 0.9 μsec | 0.25 | 14 | 50 | 8,000 | 180 |

EXAMPLES 21 to 25

On Support AF was coated Coating solution (5) for photopolymerizing layer shown below by a bar and dried in an oven at 100° C. for 60 seconds to form an photopolymerizing layer having a dry coating amount of 1.0 g/m$^2$, and on the photopolymerizing layer was coated Coating solution (1) for protective layer described in Examples 15 to 18 by a bar and dried at 120° C. for one minute to form a protective layer having a dry coating amount of 0.15 g/m$^2$, thereby preparing a lithographic printing plate precursor.

Coating solution (5) for photopolymerizing layer was prepared in the same manner as in Coating solution (1) for photopolymerizing layer except for changing the specific polymer compound used in Photosensitive solution (1) to each of those shown in Table 6.

TABLE 6

| | Specific Polymer Compound |
|---|---|
| Example 21 | (1) |
| Example 22 | (3) |
| Example 23 | (6) |
| Example 24 | (19) |
| Example 25 | (20) |

Comparative Example 5

A lithographic printing plate precursor was prepared in the same manner as in Example 21 except for changing the specific polymer compound to the polymer described in Comparative Example 2.

Each of the lithographic printing plate precursors obtained in Examples 21 to 25 and Comparative Example 5 described above was subjected to the exposure, printing and evaluation in the same manner as in Examples 1 to 14.

The results of the evaluations are shown in Table 7.

TABLE 7

| | On-Machine Development Property (number of sheets) | Reproducibility of Fine Line (μm) | Printing Durability (number of sheets) |
|---|---|---|---|
| Example 21 | 20 | 14 | 30,000 |
| Example 22 | 25 | 18 | 20,000 |
| Example 23 | 20 | 20 | 15,000 |
| Example 24 | 25 | 14 | 35,000 |
| Example 25 | 20 | 14 | 30,000 |
| Comparative Example 5 | 40 | 20 | 5,000 |

EXAMPLE 101

On Support AF described above was coated Coating solution (101) for photopolymerizing layer shown below by a bar and dried in an oven at 100° C. for 60 seconds to form an photopolymerizing layer having a dry coating amount of 1.0 g/m² thereby preparing a lithographic printing plate precursor.

Coating solution (101) for photopolymerizing layer was prepared by mixing and stirring Photosensitive solution (101) shown below and Microcapsule solution (1) described in Example 1 just before the coating.

Photosensitive Solution (101)

Photosensitive solution (101) was prepared in the same manner as in Photosensitive solution (1) described in Example 1 except for changing Compound (2) to Compound (22) as the specific polymer compound.

Synthesis Example 2

Synthesis of Specific Polymer Compound (Compound (22)) Described in Example 101

In a 1,000 ml three-necked flask equipped with a condenser and a stirrer was charged 92 g of 1-methoxy-2-propanol followed by beating at 75° C. To the solution was added dropwise a solution prepared by dissolving 50 g of benzyl methacrylate, 29.1 g of Placcel F (trade name: produced by Daicel Chemical Industries, Ltd.) and 0.5 g of V-601 (trade name: produced by Wako Pure Chemical Industries, Ltd.) in 92 g of 1-methoxy-2-propanol under nitrogen atmosphere over a period of 2.5 hours.

The solution was subjected to reaction at 75° C. for 2 hours and then poured into water to deposit a copolymer. The copolymer was collected by filtration, washed and dried to obtain Compound (22). As a result of measurement of a weight average molecular weight by gel permeation chromatography (GPC) using polystyrene as a standard substance, it was found to be 140,000. As a result of measurement of Tg by a differential scanning calorimeter (DSC), it was found to be 50° C.

Syntheses of polymer compounds used in Examples 102 to 110 described below were carried out in the same manner as in Synthesis Example 2 above. The weight average molecular weight and Tg of the polymer compounds are shown in Tables 6, 7 and 9.

Comparative Example 101

A lithographic printing plate precursor was prepared in the same manner as in Example 1 except for changing the specific polymer compound to polystyrene (weight average molecular weight: 100,000, Tg: 100° C.) in the formation of photopolymerizing layer.

TABLE 8

| | Support | Specific Polymer Compound | Weight Average Molecular Weight | Tg (° C.) |
|---|---|---|---|---|
| Example 101 | AF | Compound (22) | 150,000 | 50 |
| Example 102 | CF | Compound (24) | 150,000 | 10 |
| Example 103 | DF | Compound (25) | 120,000 | 70 |

EXAMPLE 104

On Support CF described above was coated Coating solution (102) for photopolymerizing layer shown below by a bar and dried in an oven at 100° C. for 60 seconds to form an photopolymerizing layer having a dry coating amount of 1.0 g/m² thereby preparing a lithographic printing plate precursor.

Coating Solution (102) for Photopolymerizing Layer

Coating solution (102) for photopolymerizing layer was prepared in the same manner as in Coating solution (2) for photopolymerizing layer described in Example 8 except for changing Compound (6) to Compound (23) as the specific polymer compound.

EXAMPLES 105 to 106

Lithographic printing plate precursors were prepared in the same manner as in Example 104 except for changing the support and the specific polymer compound used in the formation of photopolymerizing layer to those shown in Table 9 below.

TABLE 9

| | Support | Specific Polymer Compound | Weight Average Molecular Weight | Tg (° C.) |
|---|---|---|---|---|
| Example 104 | CF | Compound (23) | 100,000 | 20 |
| Example 105 | DF | Compound (26) | 110,000 | 75 |
| Example 106 | DF | Compound (28) | 120,000 | 70 |

Comparative Example 102

A lithographic printing plate precursor was prepared in the same manner as in Example 104 except for changing the specific polymer compound to the polymer described in Comparative Example 2.

2. Exposure, Printing and Evaluation

Each of the lithographic printing plate precursors obtained in the examples and comparative examples described above was subjected to the exposure, printing and evaluation in the same manner as in Examples 1 to 14.

The results of the evaluations are shown in Table 10 together with the result of the on-machine development property.

TABLE 10

| | On-Machine Development Property (number of sheets) | Reproducibility of Fine Line (μm) | Printing Durability (number of sheets) |
|---|---|---|---|
| Example 101 | 40 | 20 | 18,000 |
| Example 102 | 40 | 16 | 20,000 |
| Example 103 | 30 | 16 | 20,000 |
| Example 104 | 35 | 16 | 20,000 |
| Example 105 | 35 | 20 | 20,000 |
| Example 106 | 30 | 16 | 20,000 |
| Comparative Example 101 | 60 | 30 | 12,000 |
| Comparative Example 102 | 40 | 20 | 5,000 |

EXAMPLES 107 to 108

Lithographic printing plate precursors were prepared in the same manner as in Example 101 except for changing the support and the specific polymer compound used in the formation of photopolymerizing layer to those shown in Table 11 below

TABLE 11

| | Support | Specific Polymer Compound | Weight Average Molecular Weight | Tg (° C.) |
|---|---|---|---|---|
| Example 107 | CF | Compound (24) | 150,000 | 10 |
| Example 108 | DF | Compound (25) | 120,000 | 70 |
| Example 109 | CF | Compound (21) | 120,000 | 35 |
| Example 110 | DF | Compound (26) | 110,000 | 75 |

On the support described in Table 9 above was coated Coating solution (103) for photopolymerizing layer shown below by a bar and dried in an oven at 100° C. for 60 seconds to form an photopolymerizing layer having a dry coating amount of 1.0 g/m², and on the photopolymerizing layer was coated Coating solution (1) for protective layer described in Examples 15 to 17 by a bar and dried at 120° C. for one minute to form a protective layer having a dry coating amount of 0.5 g/m², thereby preparing a lithographic printing plate precursor.

Coating Solution (103) for Photopolymerizing Layer

Coating solution (103) for photopolymerizing layer was prepared in the same manner as in Coating solution (3) for photopolymerizing layer described in Examples 15 to 17 except for changing the specific polymer compound to each of those shown in Table 11.

Comparative Example 103

A lithographic printing plate precursor was prepared in the same manner as in Example 107 except for changing Support CF to Support AF and the specific polymer compound to tert-butyl methacrylate (weight average molecular weight: 120,000, Tg: 120° C.) in the formation of photopolymerizing layer.

EXAMPLES 109 to 110

Lithographic printing plate precursors were prepared in the same manner as in the preparation of Lithographic printing plate precursors 107 to 108 except for changing Coating solution (103) for photopolymerizing layer to Coating solution (104) for photopolymerizing layer having the composition shown below, respectively.

Coating Solution (104) for Photopolymerizing Layer

Coating solution (104) for photopolymerizing layer was prepared in the same manner as in Coating solution (4) for photopolymerizing layer described in Examples 18 to 20 except for changing the specific polymer compound to each of those shown in Table 11.

Comparative Example 104

A lithographic printing plate precursor was prepared in the same manner as in Example 109 except for changing Support CF to Support AF and the specific polymer compound to poly(tert-butyl methacrylate) (weight average molecular weight: 120,000, Tg: 120° C.) in the formation of photopolymerizing layer.

Each of the lithographic printing plate precursors obtained was subjected to the exposure, printing and evaluation in the same manner as in Examples 15 to 20.

The results obtained are shown in Table 12 below.

TABLE 12

|  | Light Source | Drawing Time per Pixel | Sensitivity (mJ/cm$^2$) | Reproducibility of Fine Line (μm) | On-Machine Development Property (number of sheet) | Printing Durability (number of sheet) | White Lamp Safety (min) |
|---|---|---|---|---|---|---|---|
| Example 107 | Semiconductor | 0.9 μsec | 0.23 | 14 | 40 | 15,000 | 240 |
| Example 108 | Laser of 405 nm | 0.9 μsec | 0.22 | 14 | 35 | 14,000 | 240 |
| Example 109 | Semiconductor | 100 μsec | 0.15 | 12 | 30 | 18,000 | 180 |
| Example 110 | Laser of 375 nm | 1 msec | 0.15 | 14 | 30 | 16,000 | 180 |
| Comparative Example 103 | Semiconductor Laser of 405 nm | 0.9 μsec | 0.2 | 12 | 80 | 14,000 | 240 |
| Comparative Example 104 | Semiconductor Laser of 375 nm | 0.9 μsec | 0.25 | 14 | 50 | 8,000 | 180 |

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising:
a support; and
a photopolymerizing layer containing (A) an infrared absorbing agent, (B) a polymerization initiator, (C) a polymerizable compound, and (D) a binder polymer, the photopolymerizing layer being removable by at least one of a printing ink and dampening water, wherein the binder polymer has at least one of an ether group, an ester group, and an amido group in a side chain of a repeating unit constituting the binder polymer, said ether group, ester group and amido group being represented by the following formulae (1) to (3), respectively:

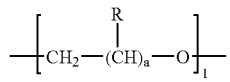  (1)

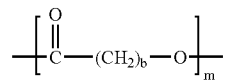  (2)

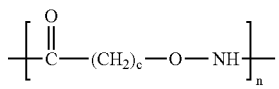  (3)

wherein R represents a hydrogen atom or a methyl group; "a" represents an integer of 1,3, or 5; "b" represents an integer of from 2 to 5; "c" represents an integer of from 2 to 7; "l" represents an integer of from 2 to 100; and "m" and "n" each independently represents an integer of from 1 to 100.

2. The lithographic printing plate precursor according to claim 1, wherein "l" is an integer of from 2 to 9.

3. The lithographic printing plate precursor according to claim 1, wherein the photopolynmerizing layer contains a microcapsule including at least one of the infrared absorbing agent, the polymerization initiator, the polymerizable compound, and the binder polymer therein.

4. A lithographic printing method which comprises:
mounting a lithographic printing plate precursor on a printing machine, the lithographic printing plate precursor comprising a photopolymerizing layer capable of recording upon infrared ray irradiation, the photopolymerizing layer containing (A) an infrared absorbing agent, (B) a polymerization initiator, (C) a polymerizable compound, and (D) a binder polymer, and then imagewise exposing the lithographic printing plate precursor with an infrared laser; or imagewise exposing a lithographic printing plate precursor with an infrared laser, the lithographic printing plate precursor comprising a photopolymerizing layer capable of recording upon infrared ray irradiation, the photopolymerizing layer containing (A) an infrared absorbing agent, (B) a polymerization initiator, (C) a polymerizable compound, and (D) a binder polymer, and then mounting the exposed lithographic printing plate precursor on the printing machine; and supplying a printing ink and dampening water to the exposed lithographic printing plate precursor to remove a Laser-unexposed area of the photopolymerizing layer, wherein the binder polymer has at least one of an ether group, an ester group, and an amido group in a side chain of a repeating unit constituting the binder polymer, said ether group, ester group, and amido group being represented by the following formulae (1) to (3), respectively:

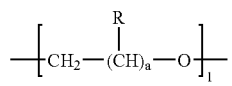  (1)

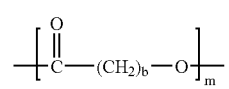  (2)

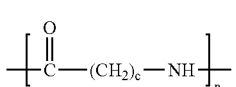  (3)

wherein R represents a hydrogen atom or a methyl group; "a" represents an integer of 1, 3, or 5; "b" represents an integer of from 2 to 5; "c" represents an integer of from 2 to 7; "l" represents an integer of from 2 to 100; and "m" and "n" each independently represents an integer of from 1 to 100.

5. The lithographic printing method according to claim 4, wherein "l" is an integer of from 2 to 9.

6. The lithographic printing method according to claim 4, wherein the photopolymerizing layer contains a microcapsule including at least one of the infrared absorbing agent, the polymerization initiator, the polymerizable compound, and the binder polymer therein.

7. A lithographic printing plate precursor capable of forming an image without undergoing alkali development, which comprises: a hydrophilic support; and a laser-sensitive photopolymerizing layer, wherein the photopolymerizing layer contains a polymer compound having at least one of an ether group and an amido group represented by the formulae (1) and (2), respectively:

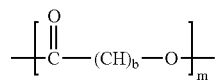

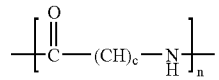

wherein "b" represents an integer of from 2 to 5; "c" reresents an inte er of from 2 to 7 and "m" and "n" each indendently represents an integer of from 1 to 100.

8. The lithographic printing plate precursor according to claim 7, wherein the polymer compound has a glass transition temperature of 90° C. or lower.

9. The lithographic printing plate precursor according to claim 7, wherein the photopolymerizing layer further contains a microcapsule.

10. A lithographic printing method which comprises:
mounting a lithographic printing plate precursor according to claim 7 on a printing machine and then imagewise exposing the lithographic printing plate precursor by a laser, or imagewise exposing a lithographic printing plate precursor according to claim 7 by a laser and then mounting the exposed lithographic printing plate precursor to a printing machine; and
supplying a printing ink and dampening water to the exposed lithographic printing plate precursor to remove a laser-unexposed area of the photopolyinerizing layer to conduct printing.

11. A lithographic printing plate precursor capable of forming an image without undergoing alkali development, which comprises: a hydrophilic support; and a laser-sensitive photopolymerizing layer, wherein the photopolymerizing layer contains a polymer compound having an ether group represented by formula (1) in the molecule of the polymer compound:

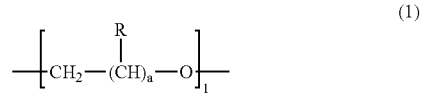

wherein R represents a hydrogen atom or a methyl group; "a" represents an integer of 1, 3, or 5; and "1" represents an integer of from 2 to 9.

12. The lithographic printing plate precursor according to claim 11, wherein the polymer compound having an ether group represented by formula (1) in the molecule has a glass transition temperature of 90° C. or lower.

13. The lithographic printing plate precursor according to claim 11, wherein "1" is an integer of from 2 to 4.

14. The lithographic printing plate precursor according to claim 11, wherein the photopolymerizing layer further contains a microcapsule.

15. A lithographic printing method which comprises:
mounting a lithographic printing plate precursor according to claim 11 on a printing machine and then imagewise exposing the lithographic printing plate precursor by a laser, or imagewise exposing a lithographic printing plate precursor according to claim 11 by a laser and then mounting the exposed lithographic printing plate precursor to a printing machine; and
supplying a printing ink and dampening water to the exposed lithographic printing plate precursor to remove a laser-unexposed area of the photopolymerizing layer to conduct printing.

* * * * *